United States Patent
Suzuki et al.

(10) Patent No.: US 7,795,965 B2
(45) Date of Patent: Sep. 14, 2010

(54) CRYOGENIC RECEIVING AMPLIFIER AND AMPLIFYING METHOD

(75) Inventors: Yasunori Suzuki, Yokohama (JP); Shoichi Narahashi, Yokohama (JP)

(73) Assignee: NTT DoCoMo, Inc., Tokyo (JP)

( * ) Notice: Subject to any disclaimer, the term of this patent is extended or adjusted under 35 U.S.C. 154(b) by 166 days.

(21) Appl. No.: 12/035,797

(22) Filed: Feb. 22, 2008

(65) Prior Publication Data
US 2008/0204149 A1   Aug. 28, 2008

(30) Foreign Application Priority Data

| Feb. 23, 2007 | (JP) | ............................ | 2007-043448 |
| May 31, 2007 | (JP) | ............................ | 2007-145589 |
| Nov. 29, 2007 | (JP) | ............................ | 2007-309239 |

(51) Int. Cl.
   *H03F 17/00*   (2006.01)
(52) U.S. Cl. .......................... 330/59; 330/289; 330/302
(58) Field of Classification Search .................. 330/59, 330/289, 302
   See application file for complete search history.

(56) References Cited

U.S. PATENT DOCUMENTS

| 3,940,706 | A | * | 2/1976 | Stegens ...................... 330/286 |
| 5,010,304 | A | * | 4/1991 | Mueller et al. .............. 330/269 |
| 5,373,261 | A | | 12/1994 | Higgins et al. |
| 5,623,233 | A | | 4/1997 | Higgins et al. |
| 5,821,825 | A | | 10/1998 | Kobayashi |
| 5,945,879 | A | | 8/1999 | Rodwell et al. |
| 6,217,210 | B1 | * | 4/2001 | Roeder et al. .................. 374/1 |
| 7,528,649 | B2 | * | 5/2009 | Whelan et al. ................. 330/2 |
| 2005/0176399 | A1 | | 8/2005 | Aparin |

| 2006/0081889 | A1 | 4/2006 | Shur et al. |

FOREIGN PATENT DOCUMENTS

| EP | 0 196 374 A1 | 10/1986 |
| JP | 2003-17948 | 1/2003 |
| WO | WO 00/45508 | 8/2000 |

(Continued)

OTHER PUBLICATIONS

Cryogenic HEMT Amplifier pp. 9-14, IEICE Technical Report (Electron Devices), ED88-122, Jan. 1989. T.Hababe et al. / with Full English translation.

(Continued)

*Primary Examiner*—Patricia Nguyen
(74) *Attorney, Agent, or Firm*—Oblon, Spivak, McClelland, Maier & Neustadt, L.L.P.

(57) ABSTRACT

The present invention discloses a cryogenic receiving amplifier using a gallium nitride high electron mobility transistor (GaN HEMT) as an amplifying device in a cryogenic temperature environment. The cryogenic receiving amplifier includes an input matching circuit which makes an impedance matching between a gate of the amplifying device and an outside of an input terminal, a gate biasing circuit which applies a DC voltage to the gate of the amplifying device, an output matching circuit which makes an impedance matching between a drain of the amplifying device and an outside of an output terminal, and a drain biasing circuit which applies a DC voltage to the drain of the amplifying device. The cooled temperature is preferably set to 150 K or below, and the GaN HEMT may be illuminated with light of a blue LED.

9 Claims, 25 Drawing Sheets

FOREIGN PATENT DOCUMENTS

WO    WO 2006/073701 A2    7/2006

OTHER PUBLICATIONS

2-GHz Band Cryogenic Receiver Front End for Mobile Communication Base Station Systems, IEICE Transactions on Communications, vol. E83-B, No. 8 pp. 1834-1843, Aug. 2000. T.Nojima et al.

FET's and HEM's at Cryogenic Temperatures—Their Properties and Use in Low-Noise Amplifiers, IEEE Transactions on Microwave Theory and Techniques, vol. 36, No. 3, pp. 552-560, Mar. 1988. M. W. Pospieszalski et al.

Ultra-low-noise cryogenic high-electron-mobility transistors, IEEE Transactions on Electron Devices, vol. 35, No. 3, pp. 249-256, Mar. 1988. K. H. G. Duh et al.

A2-GHz band Cryogenic 3-stage Amplifier for Celluar Base Station Receivers, 1999 IEICE General Conference, B-5-31, pp. 382, Mar. 1999. T.Mimura et al. w/ Full English translation.

A Hybrid Superconductive/Semiconductive Microwave Receiver, IEEE Transactions on Applied Superconductivity, vol. 7, No. 2, pp. 3067-3070,Jun. 1997. A.Romano et al.

High Power GaN-HEMT for Wireless Base Station Applications, IEICE Transcations on Electron., vol.E89-C, No. 5, pp. 608-615, May 2006. T.Kikkawa et al.

Ching-Hui Lin, et al., "Transient Pulsed Analysis on GaN HEMTs at Cryogenic Temperatures", IEEE Electron Device Letters, vol. 26, No. 10, XP-002486288, Oct. 2005, pp. 710-712.

Anders Mellberg, et al., "Cryogenic2-4 GHz Ultra Low Noise Amplifier", Microwave Symposium Digest, vol. 1 XP-002486289, Jun. 6, 2004, pp. 161-163.

A. R. Barnes, et al., "An overview of microwave component requirements for future space applications", European Gallium Arsenide and other Semiconductor Application Symposiu M, XP-010918846, Oct. 3, 2005, pp. 5-12.

Chinese Office Action (with English Translation), Application No. 200810081308.8, Issuing date: Apr. 15, 2010, pp. (16).

* cited by examiner

CRYOGENIC RECEIVING AMPLIFIER AND AMPLIFYING METHOD

BACKGROUND OF THE INVENTION

1. Field of the Invention

The present invention relates to a cryogenic receiving amplifier and an amplifying method thereof, both of which are used in a receiving system for a radio communication base station, and so forth.

2. Description of the Related Art

As an amplifier operable in an environment of a cryogenic temperature, non-patent literature 1 discloses a receiving amplifier for a satellite earth station, another receiving amplifier for radio astronomy, and so forth. Further, non-patent literature 2 discloses a study on application of a superconducting filter to a receiving system for a mobile communication base station. In the study, the superconducting filter and a cryogenic receiving amplifier form a cryogenic receiver front end. For cooling these devices, use is made of liquid nitrogen, liquid helium, or a vacuum container, thereby lowering the temperature of the receiver front end to an extent from ten and several Kelvins to around sixty Kelvins. In both the non-patent literatures, the receiving amplifier can reduce a noise figure under the cryogenic temperature environment, while the receiving amplifier can achieve a highly sensitive reception.

As disclosed in non-patent literature 3, a high electron mobility transistor (hereinafter referred to as HEMT) or a field effect transistor (hereinafter referred to as FET) is employed as a microwave semiconductor which is used in a cryogenic receiving amplifier for the purpose of reducing the noise figure. As disclosed in non-patent literature 4, it is generally known that the noise figure of a HEMT is superior to that of an FET in cryogenic temperature. HEMTs are typically made of gallium arsenide (hereinafter referred to as GaAs). With a GaAs HEMT, it is possible to obtain the noise figure of around 0.3 dB, but saturation power of at most around 15 dBm. On the other hand, with a GaAs FET, though it is impossible to obtain the same low noise figure as that of the GaAs HEMT, the saturation power of around 35 dBm can be obtained.

Non-patent literature 5 discloses another study in which features of these transistors are combined in a cryogenic receiving amplifier for a mobile communication base station. Especially, the non-patent literature 5 proposes the cryogenic receiving amplifier having a three-stage amplifier configuration including a GaAs HEMT disposed at a first stage, a GaAs FET at a second stage, and a GaAs FET at a third stage. The illustrative configuration can realize a low noise figure and a high saturation power because of the combination of the low-noise-figure HEMT disposed at the first stage and the high-saturation-power FETs disposed at the second and the subsequent stages. The non-patent literature 5 shows the noise figure of 0.25 dB, a gain of 43 dB, an output intercept point of 38.5 dBm, and a maximum power added efficiency of 15% or less. In a receiving system for a mobile communication base station, it is necessary to simultaneously amplify radio waves from mobile terminals which are positioned at different distances from the base station in the same cell. For this purpose, the output intercept point is required to be from 1 to 2 W.

Referring to non-patent literature 6, in recent years, an increasing study has been made on a gallium nitride high electron mobility transistor (hereinafter also referred to as GaN HEMT) as a high-power microwave semiconductor. A feature is that the GaN HEMT can be operated at a higher drain-source voltage than that of the GaAs FET. Thus, an amplifier can be implemented with a high load impedance, resulting in a reduction in loss in a matching circuit. There is an additional advantage in that a higher operating temperature can be set in the GaN HEMT, that is, the GaN HEMT has a high heat tolerance. It is thereby possible to provide a downsized radiator to externally dissipate the heat produced by the GaN HEMT, thus realizing a smaller and lighter amplifier as a whole. Because of these features, discussions have been made on application of a GaN HEMT to a transmitting amplifier for a base station as a high-power microwave semiconductor used at a room temperature.

Non-patent literature 1: Hamabe, Saito, Ohmura, Mimino, "Cryogenic HEMT amplifier", IEICE Technical Report (Electron Devices), ED88-122, January 1989.

Non-patent literature 2: T. Nojima, S. Narahashi, T. Mimura, K. Satoh, Y. Suzuki, "2-GHz band cryogenic receiver front end for mobile communication base station systems", IEICE Transactions on Communications, vol. E83-B, no. 9, pp. 1834-1843, August 2000.

Non-patent literature 3: M. W. Pospieszalski, S. Weinreb, R. D. Norrod, and R. Harris, "FET's and HEMT's at cryogenic temperatures—their properties and use in low-noise amplifiers—", IEEE Transactions on Microwave Theory and Techniques, vol. 36, no. 3, pp. 552-560, March 1988.

Non-patent literature 4: K. H. G. Duh, M. W. Pospieszalski, W. F. Kopp, A. A. Jabra, P-C Chao, P. M. Smith, L. F. Lester, J. M. Ballingall, and S. Weinreb, "Ultra-low-noise cryogenic high-electron-mobility transistors", IEEE Transactions on Electron Devices, vol. 35, no. 3, pp. 249-256, March 1988.

Non-patent literature 5: Mimura, Narahashi, Nojima, "A 2 GHz band cryogenic three-stage amplifier for cellular base station receivers", 1999 IEICE General Conference, B-5-31, March 1999.

Non-patent literature 6: T. Kikkawa, and K. Joshin, "High power GaN-HEMT for wireless base station applications", IEICE Transactions on Electron., vol. E89-C, no. 5, pp. 608-615, May 2006.

The prior-art cryogenic receiving amplifier has been used at the class "A" bias voltage to maintain both linearity and the low noise figure. Further, since employed is a transistor with such a low saturation output power as 10 to 20 dBm, it is impossible to obtain a sufficiently high power added efficiency. Additionally, the cryogenic receiving amplifier requires three or more stages of transistors to achieve a higher saturation output power of 1 W or more. On the other hand, if, for lower power consumption of the multistage cryogenic receiving amplifier, the bias voltage of the FET at the second or subsequent stage is set to the class "AB" or "B", there is a drawback of deteriorating overall linearity of the cryogenic receiving amplifier. Since linearity and power added efficiency are in a trade-off relation to each other, it is impossible to simultaneously achieve the saturation output power of 1 W or more and the power added efficiency of 50% (theoretical maximum value at the class "A" bias) or more in the prior-art configuration of the cryogenic receiving amplifier employing an FET which is set to the class "A" bias voltage.

SUMMARY OF THE INVENTION

An object of the present invention is to provide a cryogenic receiving amplifier and an amplifying method, which can simultaneously achieve a saturation output power of 1 W or more and a power added efficiency of 50% or more.

In the cryogenic receiving amplifier of the present invention, a GaN HEMT is used as an amplifying device in a cryogenic temperature environment. The cryogenic receiving amplifier has an input matching circuit for making impedance matching between the gate of the amplifying device and an outside of an input terminal of the cryogenic receiving amplifier, a gate biasing circuit for applying a DC voltage to the gate of the amplifying device, an output matching circuit for making impedance matching between a drain of the amplifying device and an outside of an output terminal, and a drain biasing circuit for applying a DC voltage to the drain of the amplifying device. The gate biasing circuit may have a resistance voltage dividing circuit designed using a gate resistance at a cryogenic temperature.

It is also possible to provide a two-stage cryogenic receiving amplifier. That is, as a first stage amplifier, a cryogenic receiving amplifier comprising a GaAs HEMT is used and, as a second stage amplifier, the cryogenic receiving amplifier comprising the GaN HEMT is used.

The cryogenic receiving amplifier of the present invention is preferably cooled to a temperature of 150 K or below.

The cryogenic receiving amplifier may have light illuminating means for illuminating the GaN HEMT with light including at least a light component having a wavelength corresponding to a band gap of gallium nitride. The light illuminating means may be employed to illuminate the GaN HEMT with any one of the light having the wavelength corresponding to the band gap of the gallium nitride, the blue light having wavelengths corresponding to the blue area of the visible spectrum, and the light containing the blue light. It is thereby possible to improve reduction in drain-to-source current of the GaN HEMT due to the current collapse phenomenon which is generated in a cryogenic temperature environment. Moreover, the light illuminating means may comprise a blue light emitting diode.

Further, the cryogenic receiving amplifier may include an integrator for integrating the drain-to-source current of the GaN HEMT, a comparator for producing a difference between an output of the integrator and a reference current value, and a controller for controlling a forward current of the blue light emitting diode to set an output of the comparator to zero. Since the drain-to-source current is gradually increased or decreased for a long time period in the cryogenic temperature environment, the drain-to-source current may be monitored to control a forward current of the blue light emitting diode by illuminating with the light.

DETAILED DESCRIPTION OF THE PREFERRED EMBODIMENTS

First Embodiment

Figure 1:
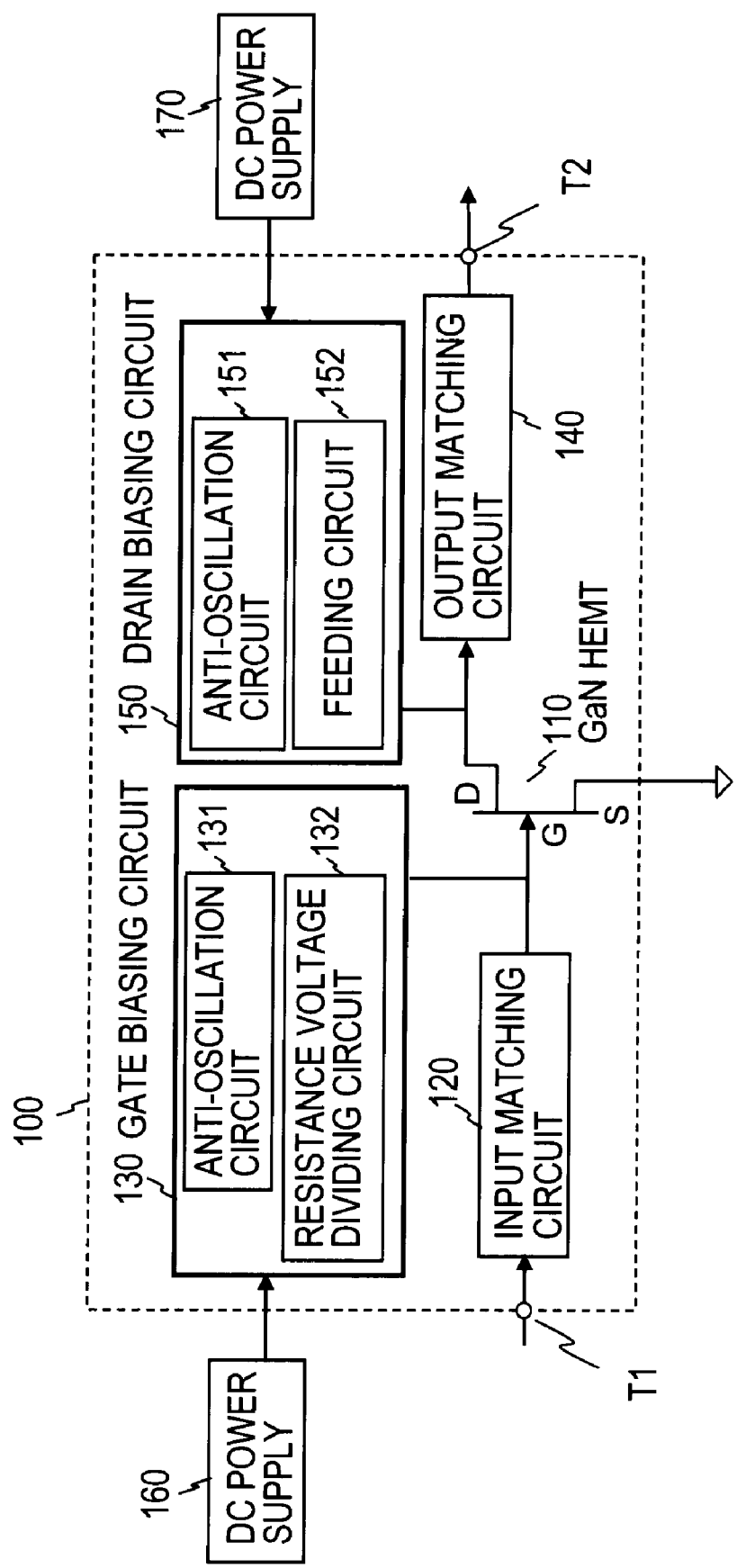
FIG. 1 is a diagram showing a configuration of a cryogenic receiving amplifier of the present invention.

FIG. 1 shows a configuration of a cryogenic receiving amplifier 100 according to the first embodiment of the present invention. In the configuration, a GaN HEMT 110 is employed as an amplifying device. The cryogenic receiving amplifier 100 includes an input matching circuit 120 which makes an impedance matching between the gate of the GaN HEMT 110 and an external apparatus connected to an input terminal T1 of the cryogenic receiving amplifier 100, a gate biasing circuit 130 which applies a DC voltage to the gate of the GaN HEMT 110, an output matching circuit 140 which makes an impedance matching between the drain of the GaN HEMT 110 and an external apparatus connected to an output terminal T2 of the cryogenic receiving amplifier 100, and a drain biasing circuit 150 which applies a DC voltage to the drain of the GaN HEMT 110.

The input matching circuit 120 and the output matching circuit 140 are designed for operation at 2 GHz, for example. The input matching circuit 120 and the output matching circuit 140 are each constructed of a transmission line with a stub having an open end, and the lengths of the stubs are adjusted for the operating frequency.

Figure 2:
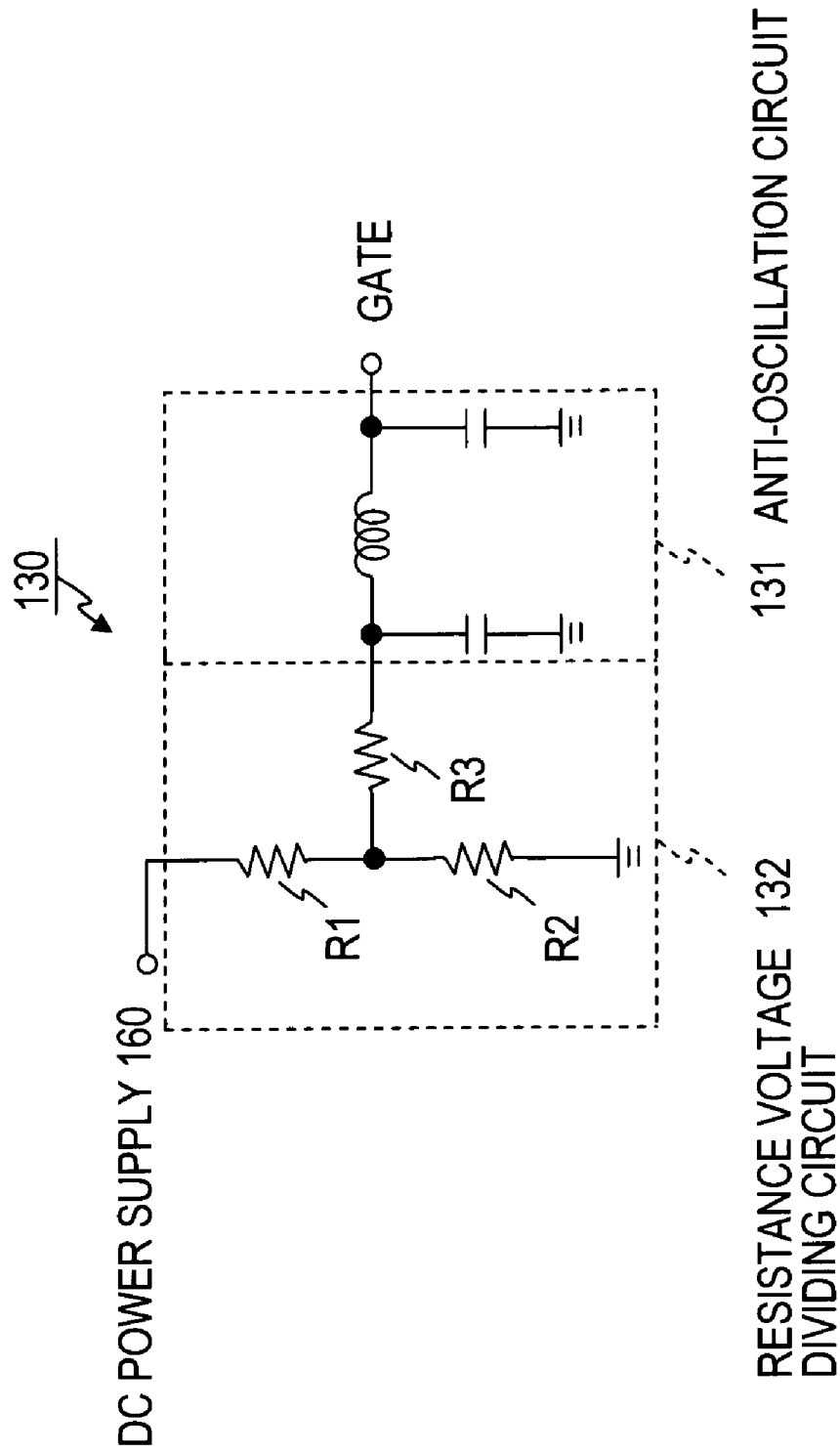
FIG. 2 is a diagram showing an illustrative gate biasing circuit.

As shown in FIG. 2, the gate biasing circuit 130 include an anti-oscillation circuit 131 and a resistance voltage dividing circuit 132. The resistance voltage dividing circuit 132 divides a voltage of a DC power supply 160 into a gate voltage of the GaN HEMT 110. The voltage dividing ratio can be expressed as a ratio of a resistance R1 to a resistance of parallel-connection of a resistance R2 and a series resistance value of a gate-side resistance including a resistance R3 and the anti-oscillation circuit 131.

The drain biasing circuit 150 includes an anti-oscillation circuit 151 and a feeding circuit 152 which are configured similarly to the anti-oscillation circuit 131 and the resistance voltage dividing circuit 132 shown in FIG. 2, respectively. The feeding circuit 152 applies, to the drain of the GaN HEMT 110, a DC voltage fed from a DC power supply 170.

When viewed from the side of the input matching circuit 120, the gate of the GaN HEMT 110 has a resistance of about 100 ohms at a room temperature, and a reduced resistance on the order of 10 ohms at a cryogenic temperature of, for example, about 60 K. Further, the GaN HEMT 110 has a higher transconductance (gm) at the cryogenic temperature than that at the room temperature. Hence, if the cryogenic receiving amplifier 100 is designed using the gate resistance of 100 ohms at the room temperature, a drain current of the GaN HEMT 110 cannot be controlled. According to the first embodiment, the resistance voltage dividing circuit 132 and the input matching circuit 120 are designed on the precondition that the gate resistance is 10 ohms.

Figure 3:
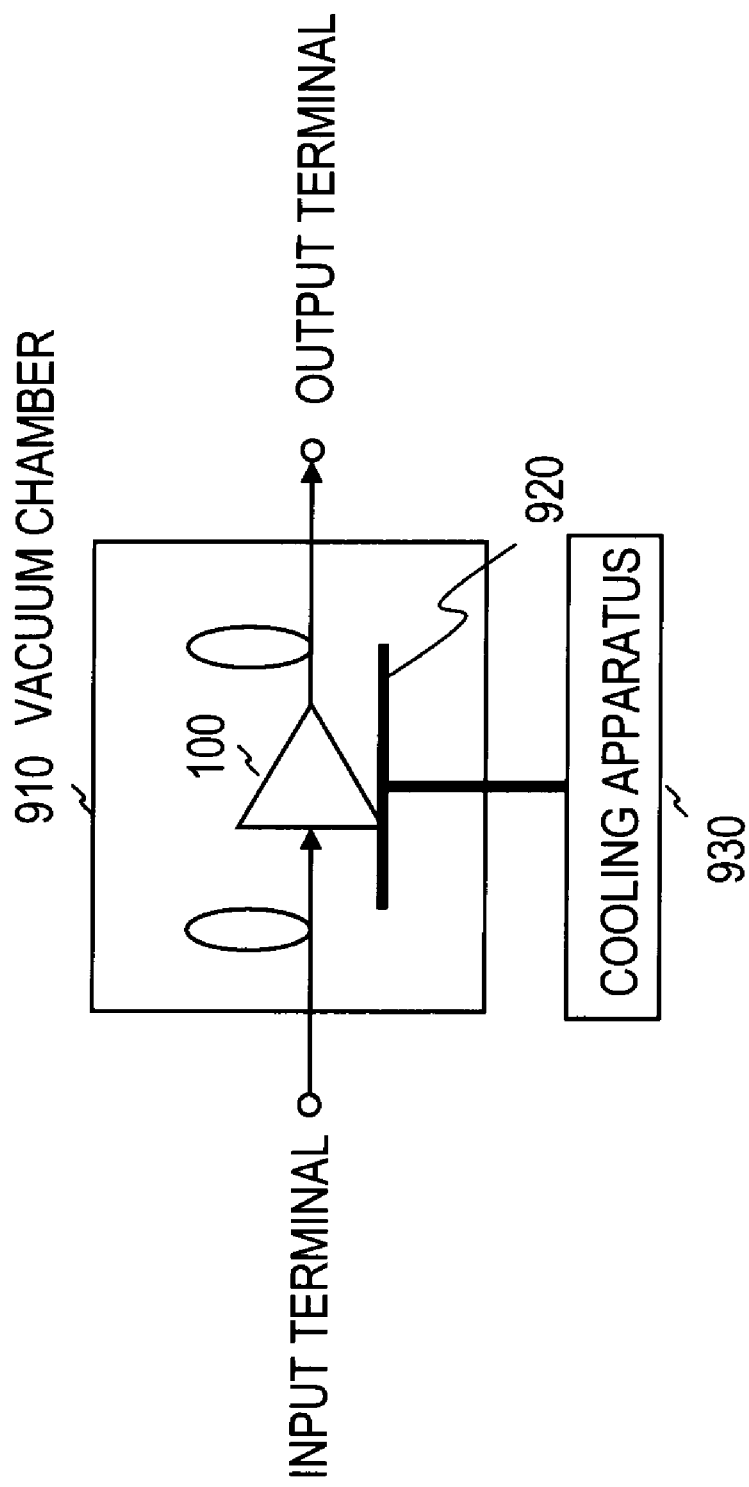
FIG. 3 is a diagram showing a configuration of an apparatus to operate the cryogenic receiving amplifier of the present invention in a cryogenic temperature environment.

FIG. 3 shows a configuration of an apparatus which operates the cryogenic receiving amplifier 100 of the first embodiment in a cryogenic temperature environment. The cryogenic receiving amplifier 100 is mounted on a cooling stage 920 in a vacuum chamber 910. The inside of the vacuum chamber 910 is continuously sucked by a vacuum pump to be maintained at a predetermined degree of vacuum. Additionally, a cooling apparatus 930 maintains the inside of the vacuum chamber 910 at a cryogenic temperature. A cooled temperature is preferably set to 150 K or below as will be described in the following. The apparatus shown in FIG. 3 is used for the experiments in the following discussion.

Figure 4:
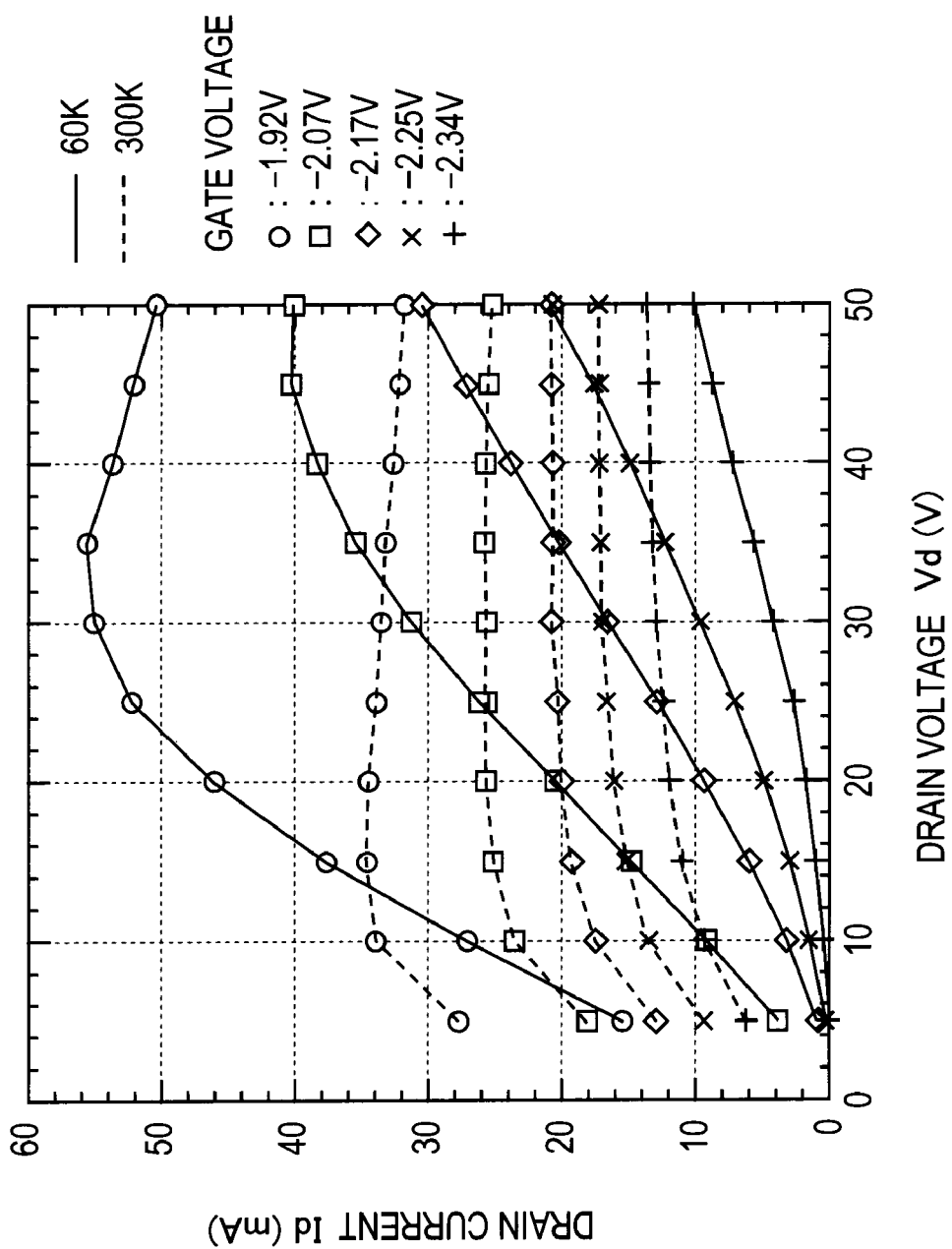
FIG. 4 is a diagram showing static characteristics of the cryogenic receiving amplifier 100 at a room temperature (of 300 K) and at a cryogenic temperature (of 60 K)

FIG. 4 shows static characteristics of the cryogenic receiving amplifier 100 at the two temperatures 300 K and 60 K. In the experiment, the gate voltages were kept constant, and the drain voltage (Vd) was increased up to 50 V while measuring the drain current (Id). The solid lines show results at the temperature of 60 K, and the broken lines show results at the temperature of 300 K. As is apparent from FIG. 4, in the static characteristics at the temperature of 60 K, the drain current increases as the drain voltage becomes larger. Nevertheless, in the static characteristics at the temperature of 300 K, even when the drain voltage becomes larger, the drain current maintains substantially constant, showing a typical static characteristic of a transistor. As can be understood from the results of the experiment shown in FIG. 4, the transconductance (gm) of the GaN HEMT 110 is increased by cooling.

Figure 5:
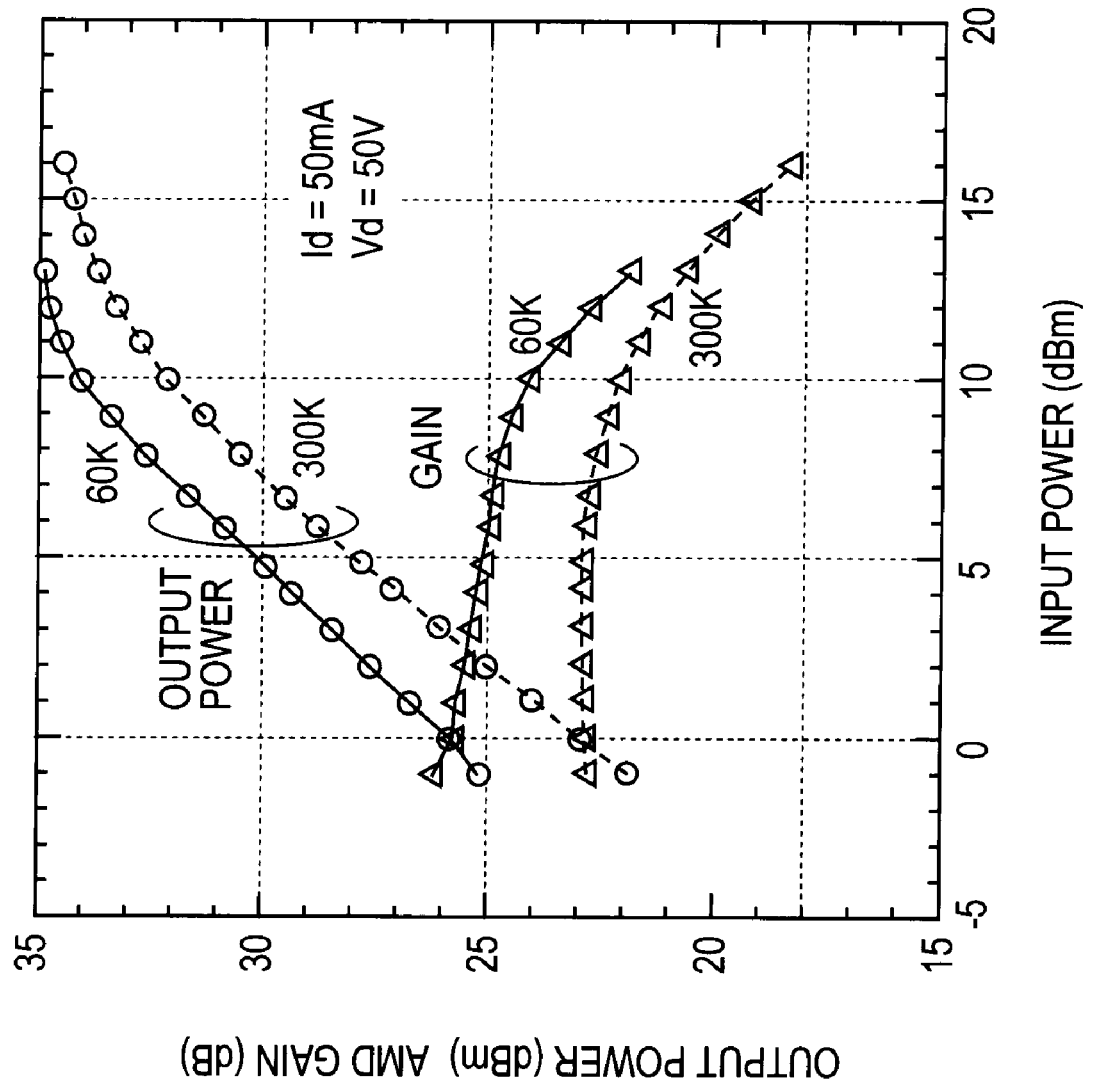
FIG. 5 is a diagram showing input/output characteristics of the cryogenic receiving amplifier 100.

FIG. 5 shows input/output characteristics of the cryogenic receiving amplifier 100 when using a single carrier wave. Test signal was at a frequency of 2 GHz. In the GaN HEMT 110, the drain voltage (Vd) was set to 50 V and the drain current to 50 mA, which makes the class "AB" biasing voltage point. A comparison between the measurement results at the temperatures of 300 K and 60 K indicates that the gain of the cryogenic receiving amplifier 100 is improved by 3 dB at maximum by the cooling. A saturation output power is 35 dBm at both temperatures of 300 K and 60 K. The increased gain obtained by the cooling is resulted from the increased transconductance (gm) by the cooling as shown in FIG. 4.

Figure 6:
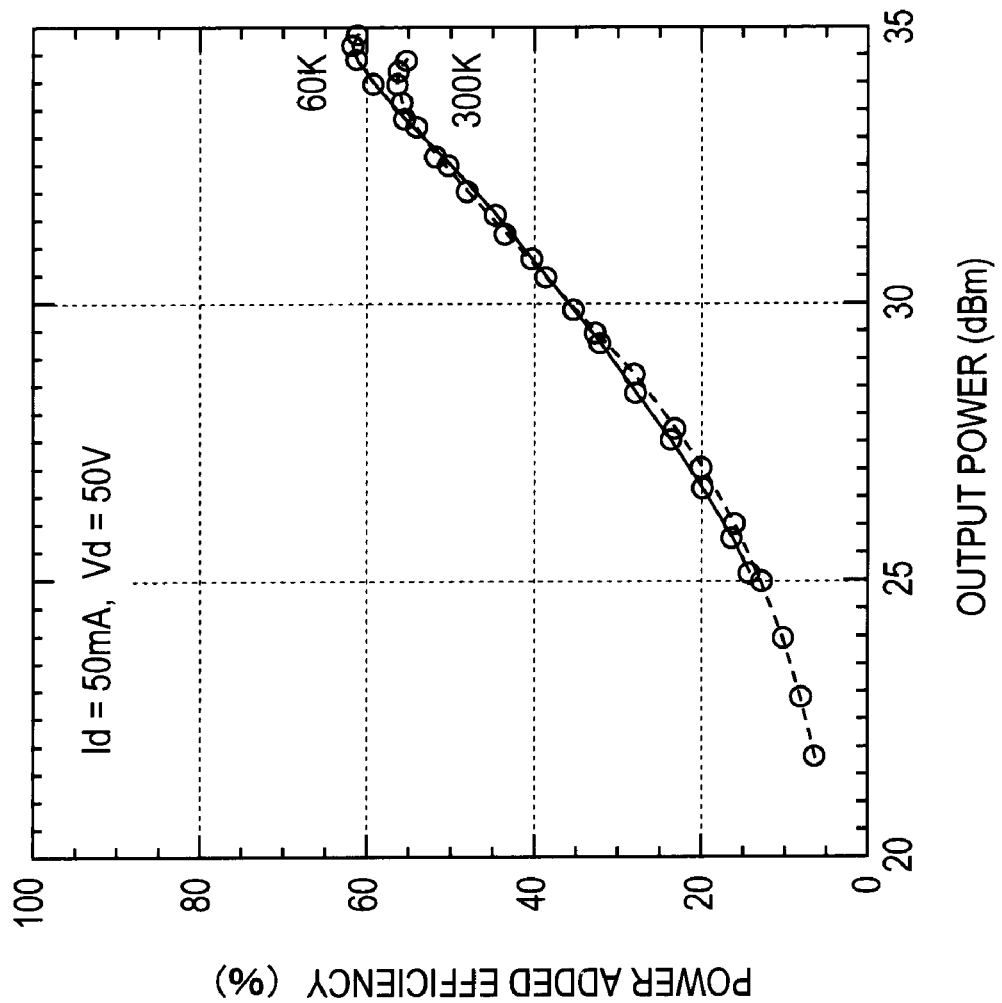
FIG. 6 is a diagram showing power added efficiency characteristics of the cryogenic receiving amplifier 100.

FIG. 6 shows power added efficiency characteristics of the cryogenic receiving amplifier 100 when using a single carrier wave. Test signal was at the frequency of 2 GHz. The power added efficiency is improved by 5% at maximum by the cooling, and the maximum power added efficiency reaches 62%, which is four or more times higher than the power added efficiency (about 15%) obtainable with the conventional multistage type amplifier which uses cooled FETs. A possible explanation is that the device can be reduced a loss by the cooling, thereby improving the power added efficiency. A GaN HEMT is a high voltage-resistant transistor which allows a high power added efficiency. The above experiment proves that the GaN HEMT is capable of achieving a high power added efficiency at the cryogenic temperature as well as at the room temperature.

Figure 7:
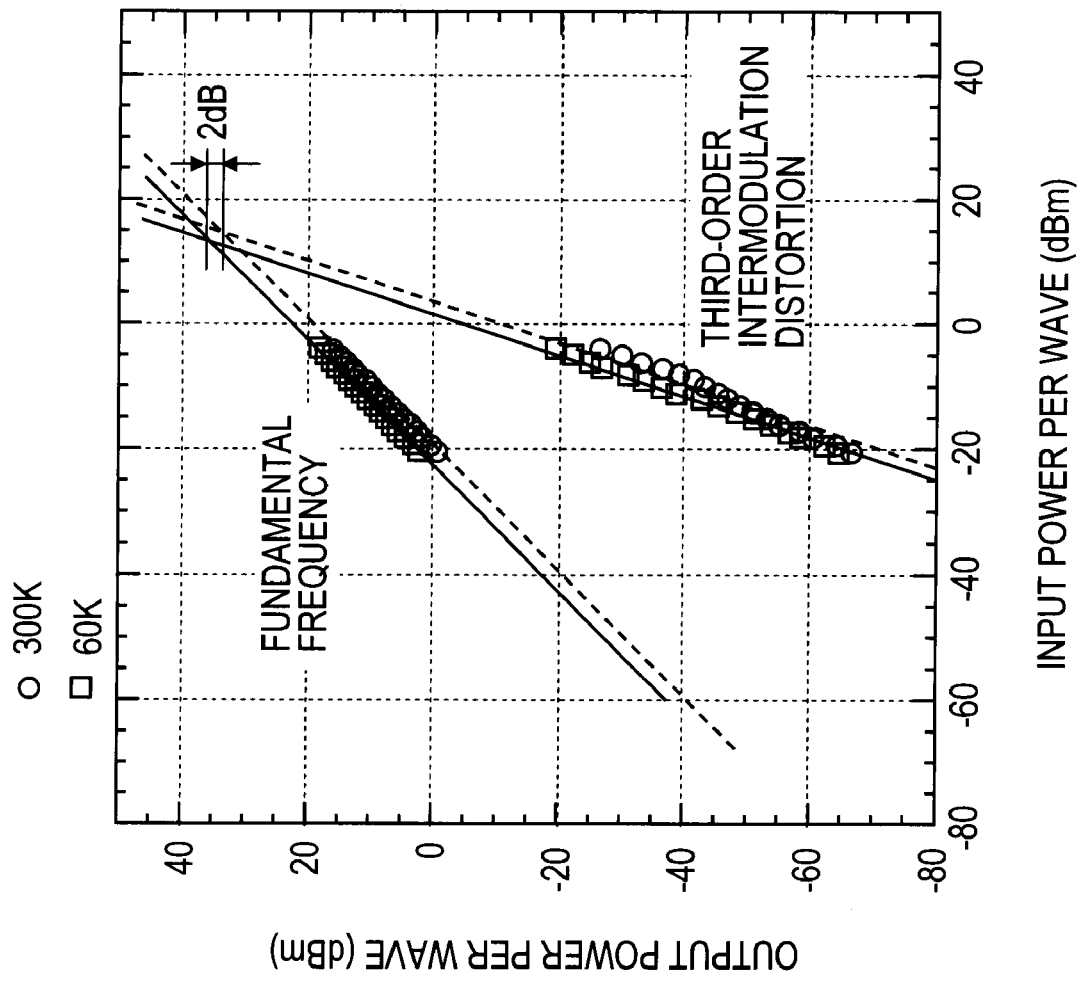
FIG. 7 is a diagram showing intermodulation distortion characteristics of the cryogenic receiving amplifier 100.

FIG. 7 shows inter-modulation distortion characteristics of the cryogenic receiving amplifier 100. The test signal was made of two carrier waves on both sides of the center frequency of 2 GHz with the same amplitude and a frequency interval of 100 kHz. At the temperature of 60 K, the output intercept point is 36 dBm. The output intercept point at the room temperature 300K is improved by 2 dB by the cooling. It is considered that the improvement in the output intercept point by the cooling is resulted from the increase in the gain and the reduction in the third-order inter-modulation distortion component.

Figure 8:
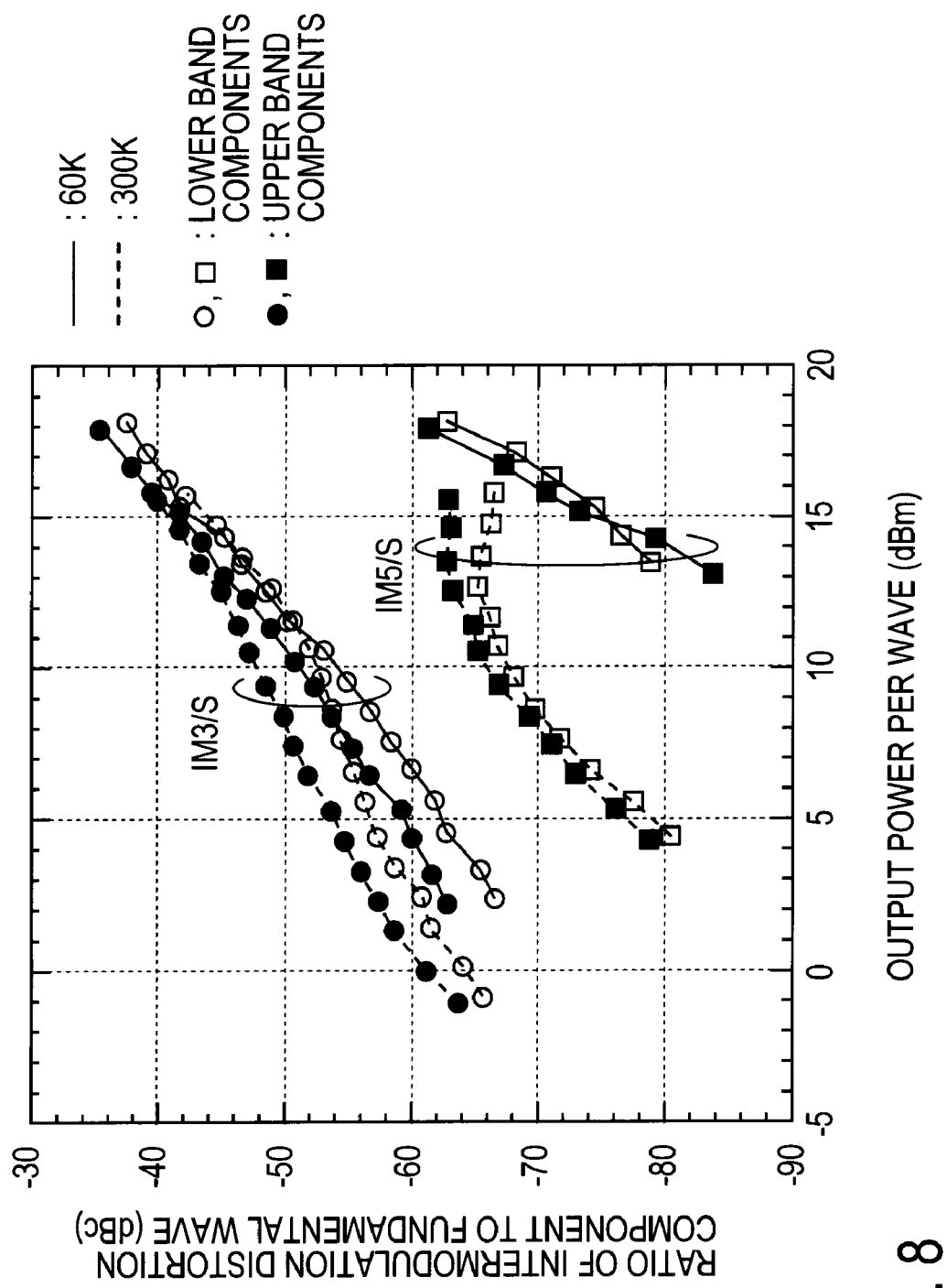
FIG. 8 is a diagram showing a ratio (IM3/S) of third-order intermodulation distortion component to fundamental wave per wave, and a ratio (IM5/S) of fifth-order intermodulation distortion component to fundamental wave per wave.

FIG. 8 shows a ratio of third-order intermodulation distortion component to fundamental wave IM3/S, and a ratio of fifth-order intermodulation distortion component to fundamental wave IM5/S. The ratios IM3/S and IM5/S are improved by 5 dB and 20 dB, respectively, at maximum by the cooling. In particular, a significant cooling effect is observable in the ratio IM5/S. The intermodulation distortion characteristic can be suppressed by the cooling probably because the cooling can provide the higher transconductance (gm) and reduce the loss in the device.

Figure 9:
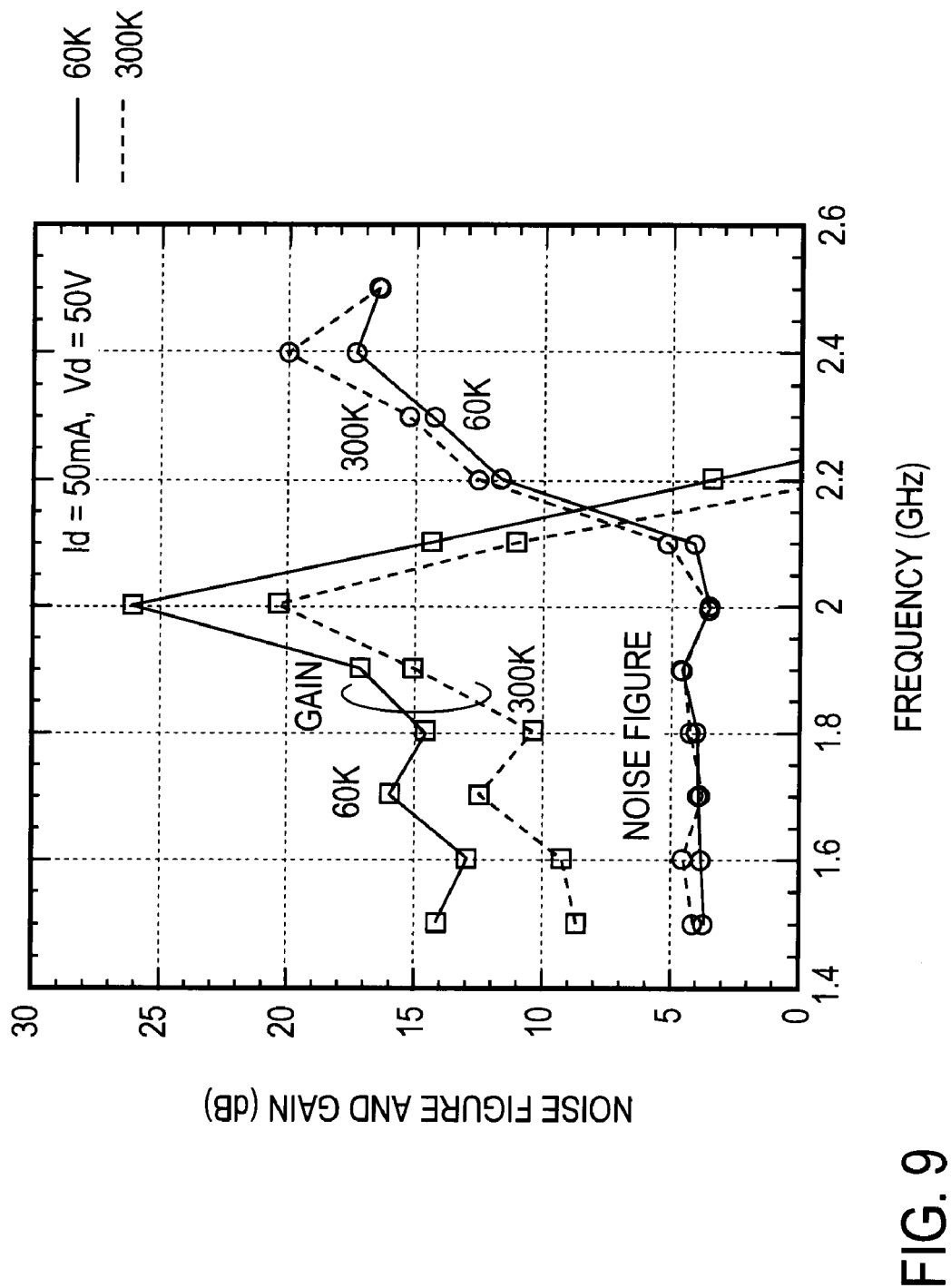
FIG. 9 is a diagram showing noise figure characteristics of the cryogenic receiving amplifier 100.

FIG. 9 shows noise figure characteristics of the cryogenic receiving amplifier 100. In the experiment, cables having a loss of 1 dB were connected to both input and output terminals of the cryogenic receiving amplifier 100 shown in FIG. 3, the cryogenic receiving amplifier 100 including the cables was completely housed in the vacuum chamber 910, and a noise figure meter was used to measure the noise figure and gain characteristics. As will be understood from FIG. 9, at the frequency of 2 GHz, substantially the same noise figure can be observed at both the temperatures of 300 K and 60 K. The input matching circuit and the output matching circuit in the cryogenic receiving amplifier 100 used in the experiment are designed for operation at 2 GHz. However, since the design is not such one that intends to minimize the noise figure, no improvement in the noise figure is observed with respect to the cooling. On the other hand, the gain is improved at the temperature of 60 K by 5 to 6 dB compared to that at the temperature of 300 K. The input matching circuit 120 and the output matching circuit 140 are designed for 2 GHz so that the maximum gain can be obtained at the frequency of 2 GHz. Incidentally, the gain becomes 0 dB or less at a frequency 2.2

GHz or higher because of designed specifications of the input matching circuit 120 and the output matching circuit 140.

As described above, in the cryogenic receiving amplifier 100 of the first embodiment, the higher transconductance (gm) results in the improvements in the gain by 3 dB at the maximum, in the maximum power added efficiency by 5%, in the output intercept point by 2 dB, in the ratio IM3/S by 5 dB at the maximum, and in the ratio IM5/S by 20 dB at the maximum. In particular, such a significantly high maximum power added efficiency of 62% is achieved, that is four or more times the efficiency 15% attainable with the conventional multistage type amplifier with cooled FETs. Since the GaN HEMT has the saturation output power of several watts or more, according to the cryogenic receiving amplifier 100 of the first embodiment, it is possible to simultaneously realize both the saturation output power of 1 W or more and the power added efficiency of 50% or more while maintaining linearity.

[Temperature Dependency Characteristic of Cryogenic Receiving Amplifier]

Figure 10:
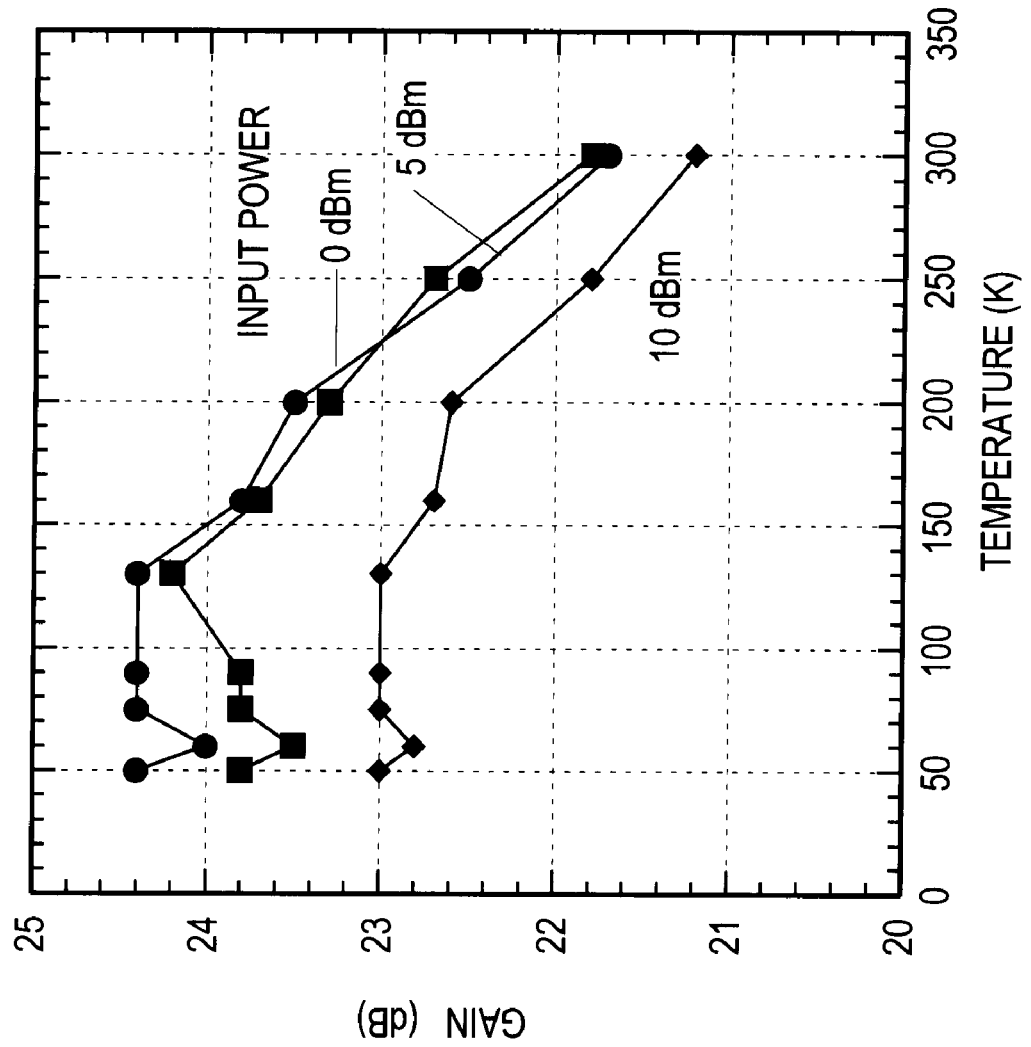
FIG. 10 is a diagram showing results of measurements of a temperature dependence characteristic concerning a gain of the cryogenic receiving amplifier 100.

The following shows temperature dependency characteristics in an operation of the cryogenic receiving amplifier employing the GaN HEMT 110 in the cryogenic environment. Measurements were made to the input/output characteristics of the cryogenic receiving amplifier 100 for various temperature settings of the cooling apparatus 930 shown in FIG. 3. In the measurement, the single carrier wave of 2 GHz was used, and the input power of the cryogenic receiving amplifier 100 was set to 0 dBm, 5 dBm, and 10 dBm. Additionally, the GaN HEMT 110 was set by the drain biasing circuit 150 and the gate biasing circuit 130 to have a drain bias voltage of 50 V and a drain current of 50 mA. FIG. 10 shows the temperature dependency characteristics of the gain of the cryogenic receiving amplifier 100. In the temperature range from 300 to 150 K, the gain increases with a linear inclination (at a rate of about 1.5 dB/100 K). However, there is no effective improvement in the gain by the cooling in a temperature range from 150 to 50 K. Accordingly, the cooling is effective in increase of the transconductance (gm) down to the temperature of 150 K.

Figure 11:
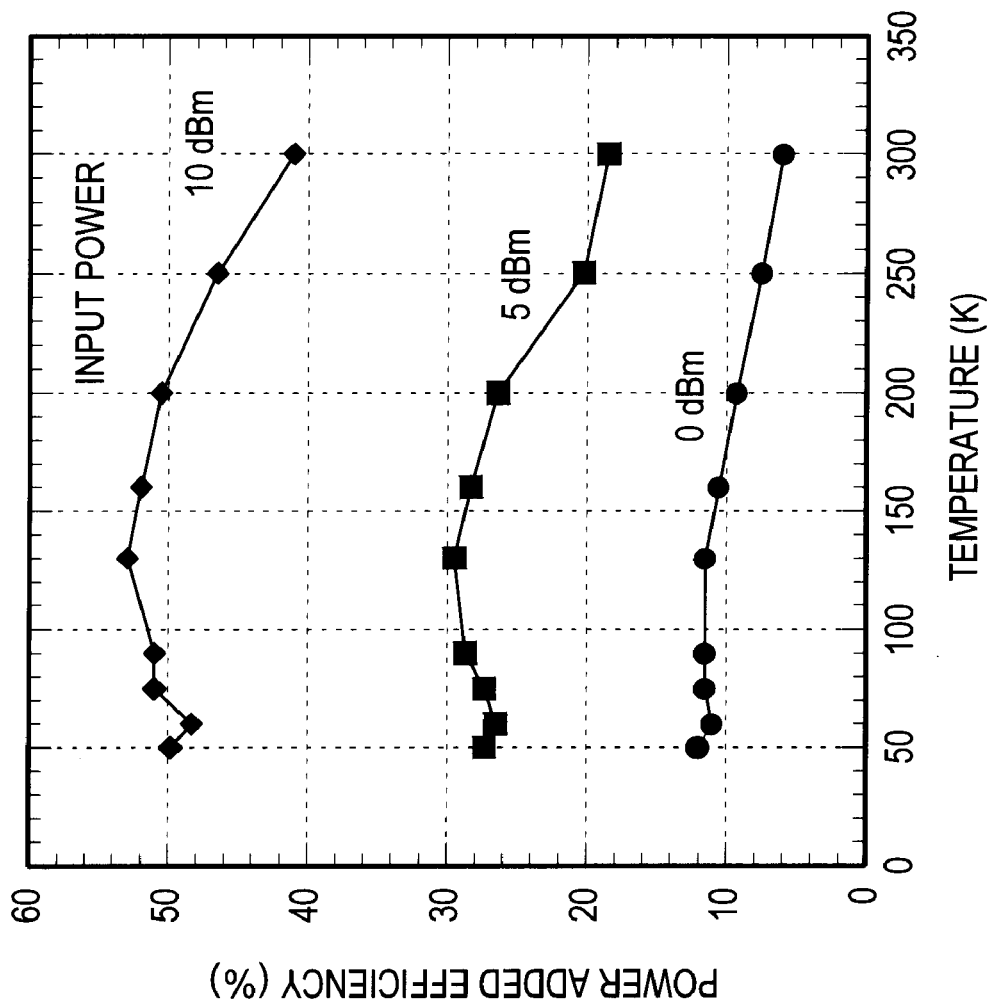
FIG. 11 is a diagram showing results of measurements of temperature dependence characteristics concerning a power added efficiency of the cryogenic receiving amplifier 100.

FIG. 11 shows temperature dependency characteristics concerning a power added efficiency of the cryogenic receiving amplifier 100. In the temperature range from 300 to 150 K, the power added efficiency of the cryogenic receiving amplifier 100 is improved by the cooling. For example, when the input power is 10 dBm, the power added efficiency at the temperature of 300 K is 40%, and the power added efficiency at the temperature of 150 K is 52%. The results show that a 12% improvement in power added efficiency can be obtained by the cooling. On the other hand, in the temperature range from 150 to 50 K, there arises no significant effect in the power added efficiency by the cooling. For example, when cooling the GaN HEMT 110 to the temperature of 150 K, the power added efficiency becomes substantially identical with that at the temperature of 50 K. Further, as shown in FIG. 11, though the degree of improvement in the power added efficiency decreases as the input power decreases, an improvement in the power added efficiency by the cooling is observable.

Figure 12:
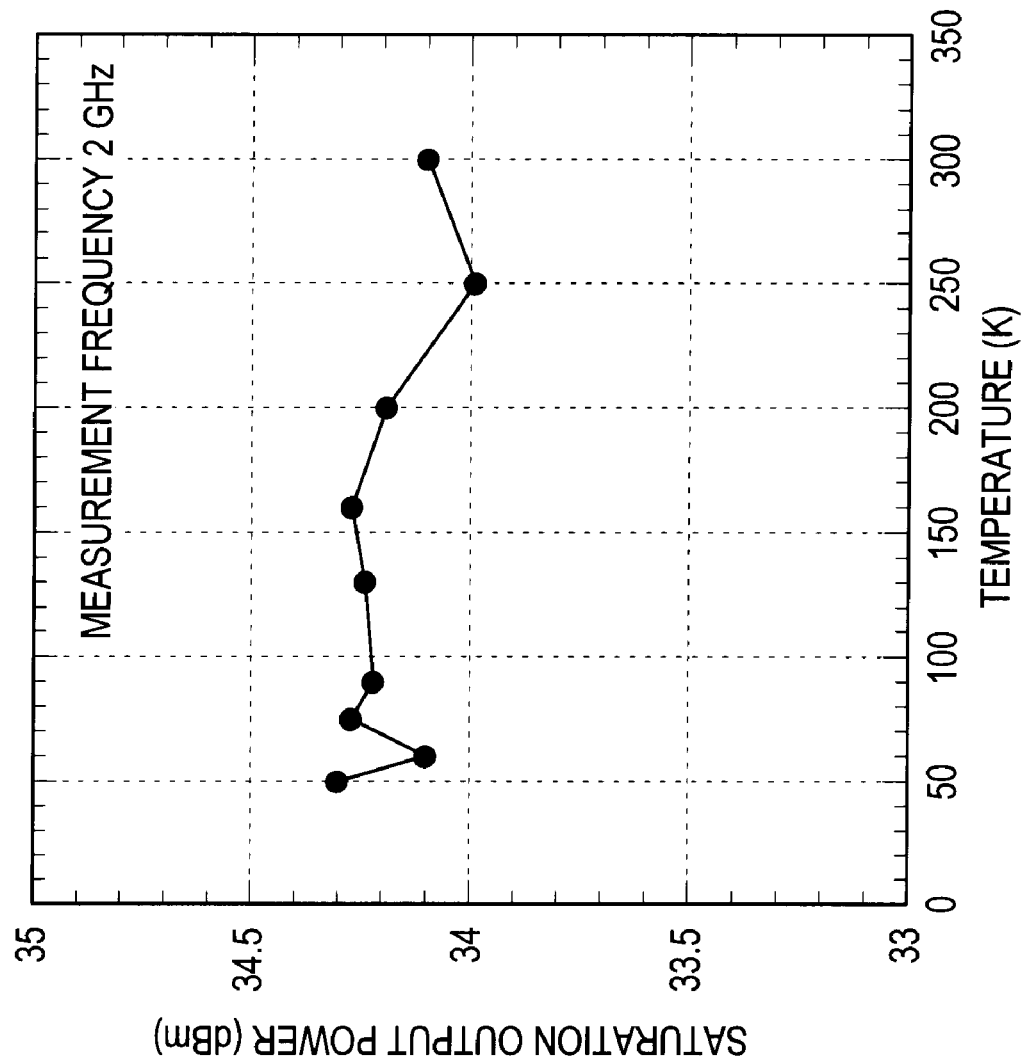
FIG. 12 is a diagram showing a result of measurement of a temperature dependence characteristic concerning a saturation output power of the cryogenic receiving amplifier 100.

FIG. 12 shows a temperature dependency characteristic of the saturation output power of the cryogenic receiving amplifier 100. The result of the measurement shows that the saturation output power ranges from 34.0 to 34.3 dBm, and the saturation output power can not be increased by the cooling. This is because the saturation output power depends on dimensional parameters (such as finger length) of the GaN HEMT 110, which are independent of temperature.

Figure 13:
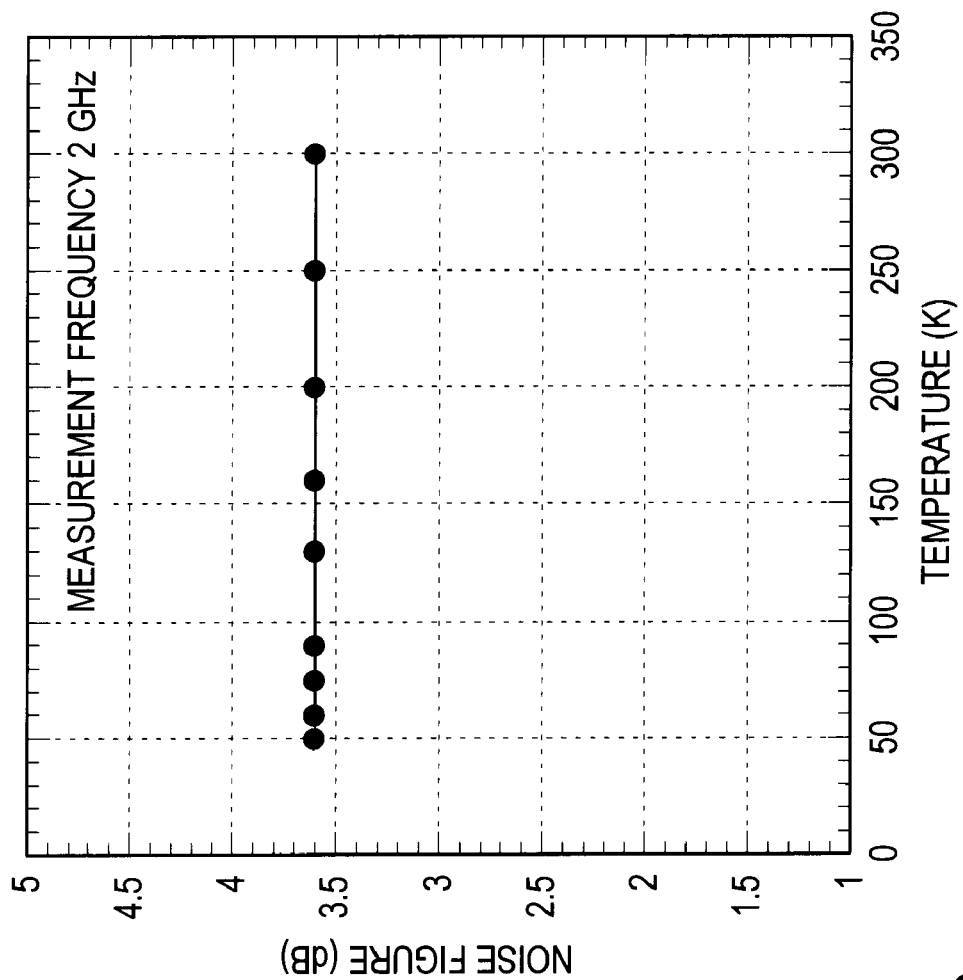
FIG. 13 is a diagram showing a result of measurement of a temperature dependence characteristic concerning a noise figure of the cryogenic receiving amplifier 100.

FIG. 13 shows a temperature dependency characteristic of a noise figure of the cryogenic receiving amplifier 100. As shown in FIG. 9, the result of measurement also shows no effect of cooling in the improvement of noise figure. It is generally known that both the gain and the noise figure can be improved by cooling a low-noise HEMT or FET. However, in the experiment, no improvement in noise figure is observed probably because the matching circuits are not designed for optimization of the noise figure, and a thermal noise is caused by employing a high-power GaN HEMT 110 with the saturation output power class of 4 W.

As is apparent from the results of experiments shown in FIGS. 10 to 13, it is at the temperature of 150 K or below where characteristics (the gain and the power added efficiency) of the cryogenic receiving amplifier 100 can sufficiently be improved by the cooling irrespective of the input/output power. Even if further cooling is made below 150 K, further improvements in gain and power added efficiency are not observed. In consequence, by using the GaN HEMT 110 as the amplifier device in the cryogenic temperature environment at the temperature of 150 K or below, it is possible to provide excellent improvements in gain and power added efficiency of the cryogenic receiving amplifier 100 irrespective of the input/output power thereof.

Known high-temperature superconducting materials which are made of YBCO films generally have critical temperatures of about 77 K. With consideration given to the fact, it is possible to cool the cryogenic receiving amplifier 100 with the GaN HEMT 100 down to the temperature of 150K or below by using, without any modification, a cooling apparatus which is capable of achieving the cryogenic temperature (of about 77 K or less) at which a superconducting state of the high-temperature superconducting material can be effected. That is, for example, it is possible to mount on the same cooling stage 920 (see FIG. 3) both the cryogenic receiving amplifier 100 and a microwave circuit (such as superconducting filter 950 shown in FIG. 14) using the high-temperature superconducting material so that both the cryogenic receiving amplifier 100 and the microwave circuit are cooled simultaneously.

Figure 14:
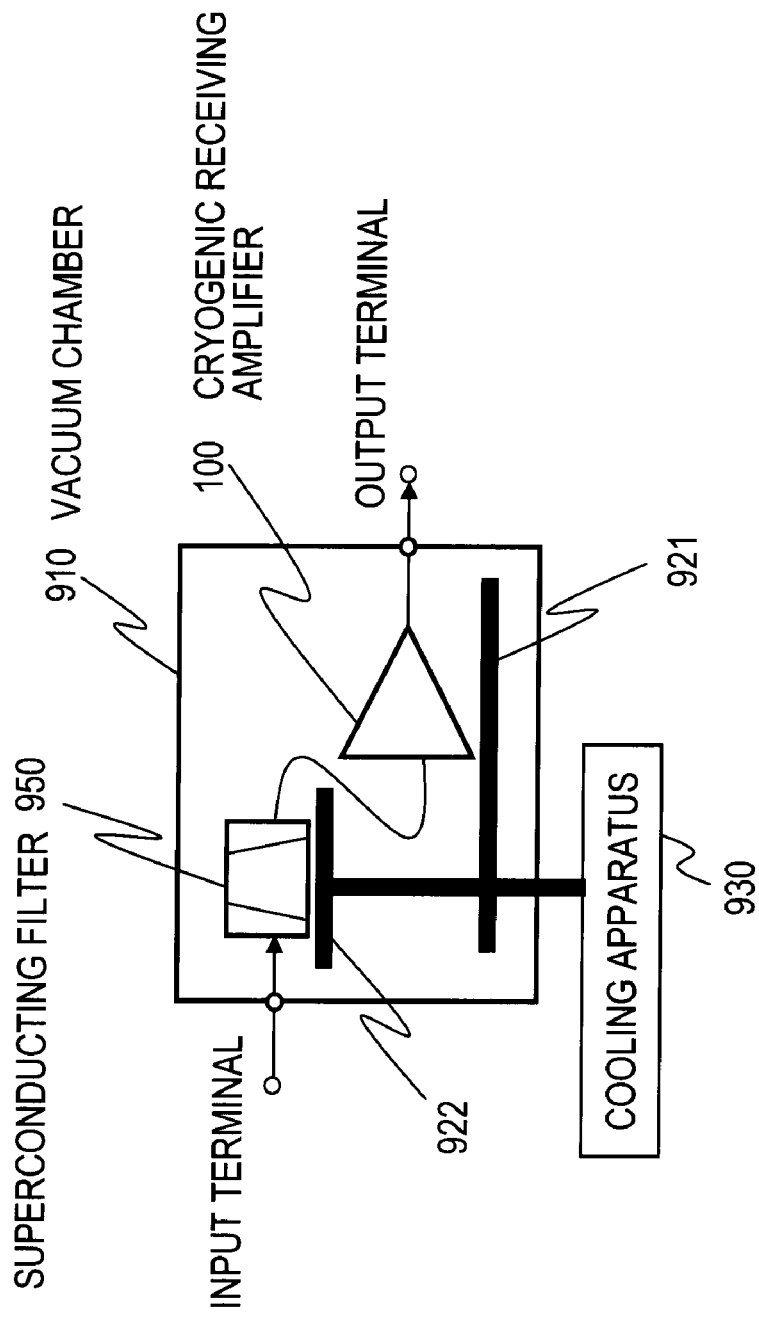
FIG. 14 is a diagram showing a configuration of a receiver front end including the cryogenic receiving amplifier 100 and a superconducting filter 950.

Needless to say, in the receiver front end including the cryogenic receiving amplifier 100 and the superconducting filter 950 using the high-temperature superconducting material, the vacuum chamber 910 may be provided with, instead of the cooling stage 920, two different stages respectively used for the superconducting filter 950 and the cryogenic receiving amplifier 100. Such a configuration of the vacuum chamber 910 is made taking advantage of the difference in temperature between the critical temperature (of about 77 K) of the high-temperature superconducting material and the maximum cooled temperature of 150 K of the cryogenic receiving amplifier 100. An example is shown in FIG. 14, in which the superconducting filter 950 and the cryogenic receiving amplifier 100 are contained in the same vacuum chamber 910. More specifically, the superconducting filter 950 is mounted on a cooling stage 922 having a higher cooling power, and the cryogenic receiving amplifier 100 is mounted on a cooling stage 921 having a lower cooling power. Such a configuration is very effective when, for example, a cooling power of the cooling apparatus 930 is limited. Further, since there is no need to cool the whole vacuum chamber 910 to a temperature below the critical temperature of the high-temperature superconducting material, it is possible to reduce the cooling power required for the cooling apparatus 930, and downsize the whole vacuum chamber 910.

Second Embodiment

Figure 15:
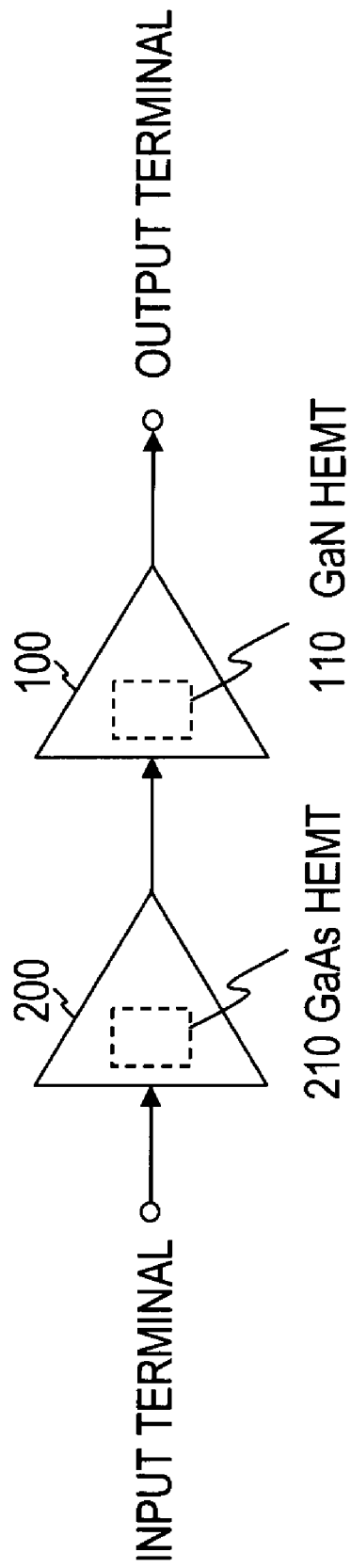
FIG. 15 is a diagram showing a configuration of a two-stage receiving amplifier with a cryogenic receiving amplifier 100 of the present invention disposed at the second stage.

FIG. 15 shows a configuration of a two-stage receiving amplifier with a cryogenic receiving amplifier 100 of the present invention disposed at the second stage. On the first stage is disposed a cryogenic receiving amplifier 200 employing a GaAs HEMT 210 having a low noise figure. The first stage cryogenic receiving amplifier 200 may be mounted, for example, on the cooling stage 921 inside the vacuum chamber 910 shown in FIG. 14, and connected in series between the superconducting filter 950 and the cryogenic receiving amplifier 100. As shown in the above-mentioned non-patent literature 5, the GaAs HEMT 210 at the first stage has such characteristics as a noise figure of 0.3 dB and a gain of 10 dB. For example, the GaN HEMT 110 at the second stage may be designed to have such characteristics as the noise figure of 2 dB and the gain of 26 dB, resulting in the noise figure of about 0.53 dB in the entire configuration of FIG. 15. Thus, as compared with the three-stage cryogenic receiver disclosed in the above non-patent literature 5, it is possible to simultaneously realize the noise figure of 0.53 dB, a saturation output power of 1 W or more, and a power added efficiency of 62%., while reducing the number of stages.

That is, by disposing the GaN HEMT at the second stage, it is possible to more significantly improve the power added efficiency compared to the prior art in which the GaAs FETs are disposed at the second and third stages.

Third Embodiment

In the third embodiment, it is contemplated to improve the reduction in drain-to-source current of a GaN HEMT 110 due to the current collapse phenomenon which is generated in a cryogenic temperature environment. In the current collapse phenomenon due to the cryogenic temperature environment, after the electron-excited state is frozen, the number of excited electrons is increased with time. Hence, even if a gate biasing voltage is set, it is impossible to avoid a phenomenon in which a drain current gradually increases or decreases.

Incidentally, it is generally known that an illumination of a semiconductor with light causes a change in characteristic of the semiconductor. This is observed because light energy is injected into the semiconductor to activate excitation of electrons. The injected light energy relates to the band gap of the semiconductor and the wavelength of the injected light. However, the wavelength of the light effective on the GaN HEMT 110 has not been found yet.

Figure 16:
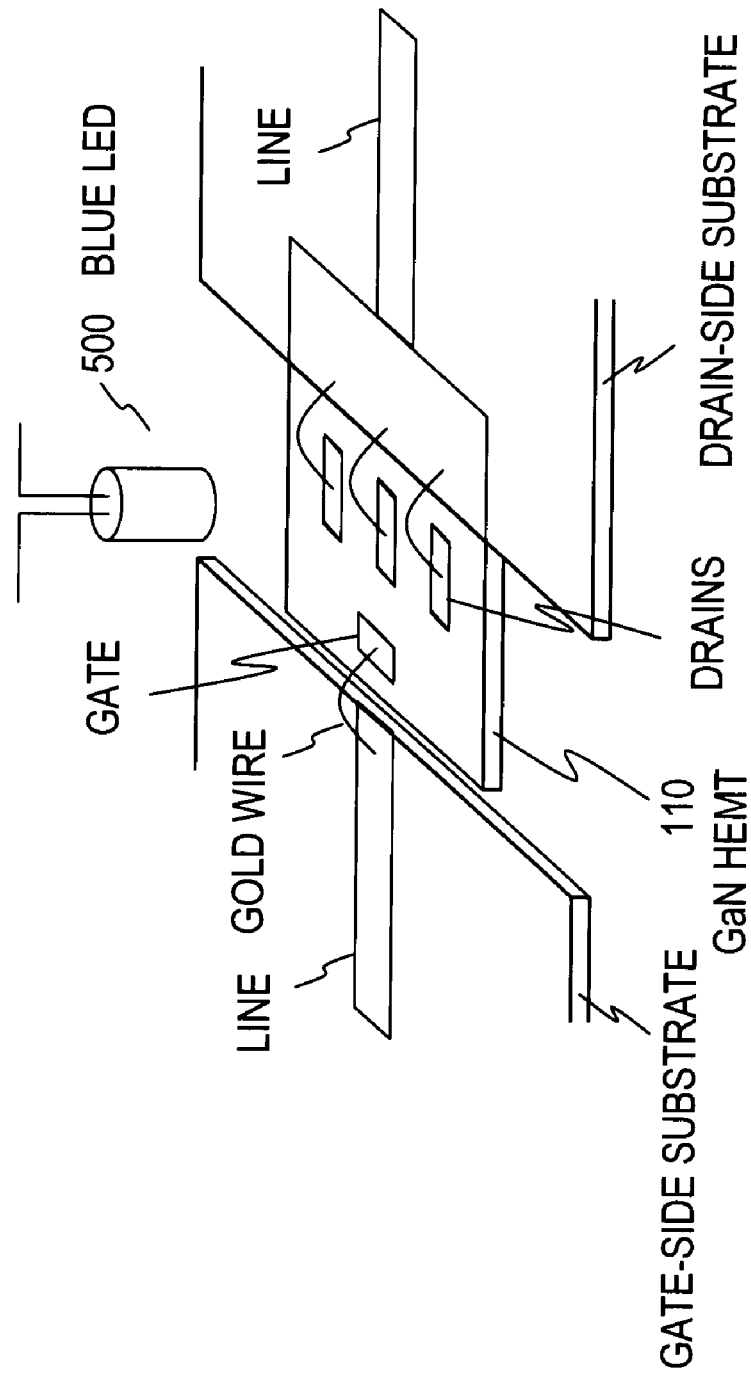
FIG. 16 is a diagram showing one embodiment of a cryogenic receiving amplifier including a GaN HEMT and a blue LED.

In the third embodiment, the following experiment discloses the wavelength of the light effective on the GaN HEMT 110. FIG. 16 shows an embodiment in which the GaN HEMT is illuminated with light from a blue LED (light emitting diode) 500. The blue LED 500 is disposed above the GaN HEMT 110. For example, the blue LED 500 is mounted in an upper space of a case of a cryogenic receiving amplifier 100, and is cooled to a cryogenic temperature together with the GaN HEMT 110.

The wavelength of the light emitted from the LED depends on the band gap of the material. Since the blue LED 500 typically employs GaN, and the GaN HEMT 110 also employs GaN, it is assumed that a major difference would not exist in band gap between the blue LED 500 and the GaN HEMT 110. Therefore, it can be considered that the emitted-light wavelength of the blue LED 500 would satisfactorily generate electron excitation in the GaN HEMT 110. In order to make this point clear, the following experiment is made with the cryogenic receiving amplifier 100 shown in FIG. 2 at the cooled temperature of 60 K.

Figure 17:
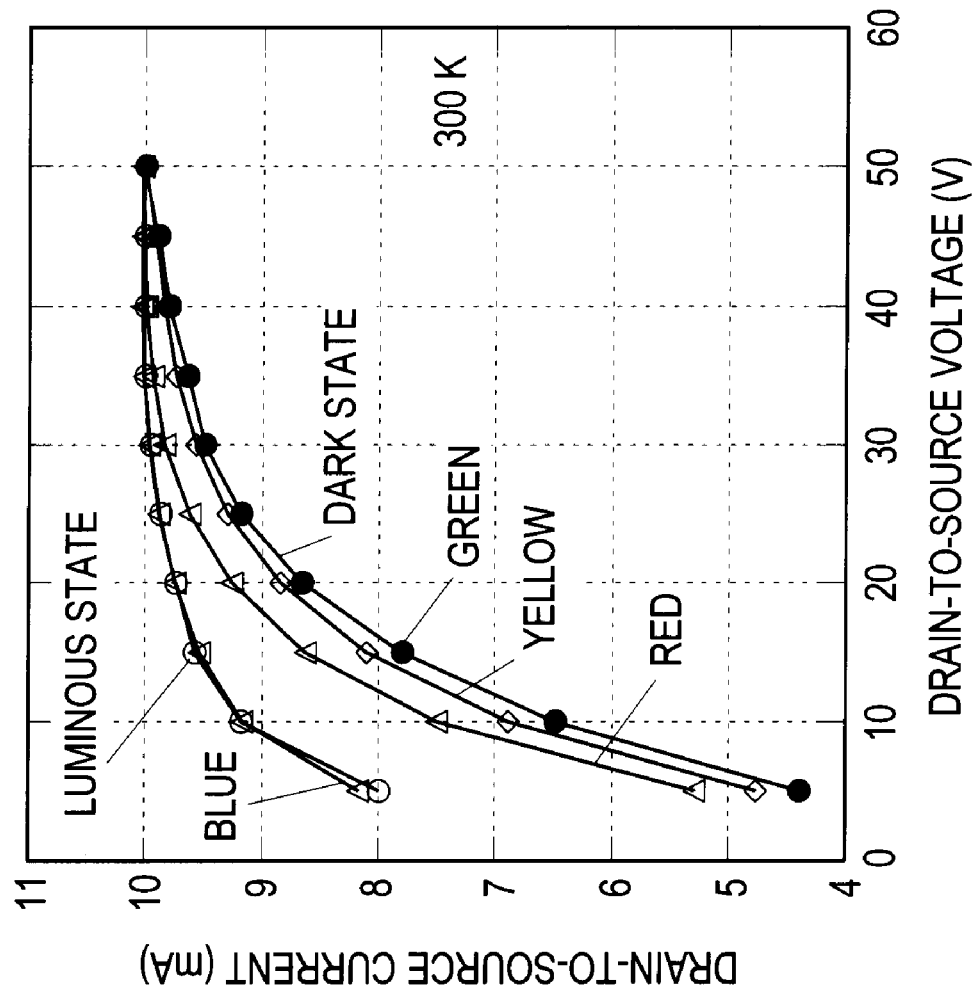
FIG. 17 is a diagram showing results of measurements of a drain-to-source current according to different types of LEDs.

FIG. 17 shows drain-to-source current characteristics with different luminescent colors of LEDs at the temperature of 300 K. The LEDs having the colors of red, yellow, green, and blue were each mounted in a black box, and the GaN HEMT 110 was illuminated with light from each of the LEDs. The term "dark state" shown in FIG. 17 means a state in which the case of the cryogenic receiving amplifier 100 is covered with a light-shielding material, and the LED is OFF. The term "luminous state" shown in FIG. 17 means a state in which the GaN HEMT 110 is illuminated with a room light. The drain-to-source current characteristic is more superior in the state where the blue LED 500 or the room light is turned ON than in the dark state or the state where any one of the red, yellow, and green LEDs is ON. Moreover, substantially the same drain-to-source current characteristic is observed in both the state in which the room light is turned ON and the state in which the blue LED 500 is turned ON. This is probably because a (visible) light of the room light includes substantially the same wavelengths as those of the light emitted from the blue LED 500. The blue LED 500 is used as emitting means in the following experiment. However, it must be noted that the present invention should not be limited to the LED, and any type of light emitting means may be employed as long as the light emitting means can emit light containing a wavelength corresponding to the band gap of the GaN, light containing a blue area (wavelengths around 430 to 490 nm) of a visible spectrum, or light containing the light of the blue area.

The cryogenic receiving amplifier 100 has the light emitting means for illuminating the GaN HEMT 110 with the light. However, it is to be noted that the present invention should not be limited to such a structure. For example, the light emitting means may be mounted external to the cryogenic receiving amplifier 100, and light emitted from the light emitting means may be introduced through a light-translucent window mounted in the cryogenic receiving amplifier 100 to illuminate the GaN HEMT 110 with the light. In such a structure, it would suffice if the light introduced through the window, i.e., the light directly falling on the GaN HEMT 110 is such light that has the wavelength corresponding to the band gap of the GaN or light of a blue area (in terms of wavelength around 430 to 490 nm) or light containing the blue area.

Figure 18:
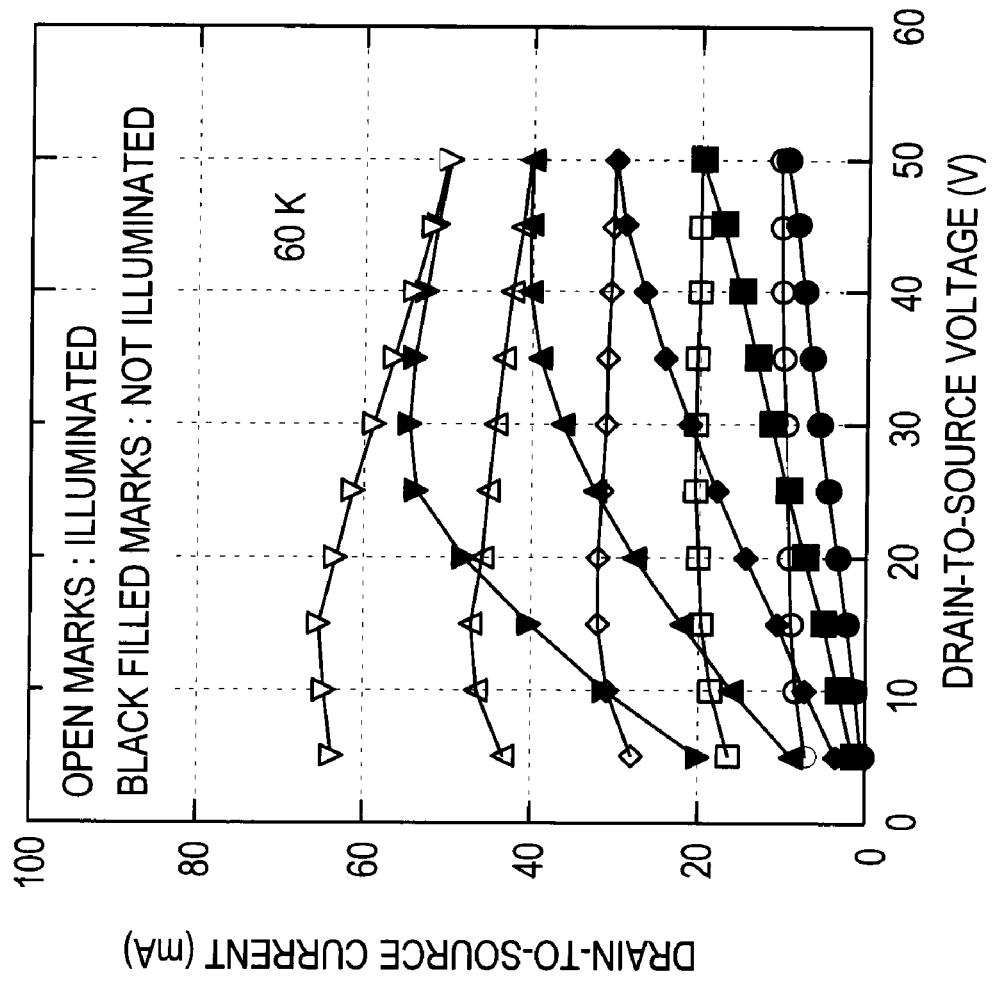
FIG. 18 is a diagram showing results of measurements concerning a static characteristic of the cryogenic receiving amplifier shown in FIG. 16.

FIG. 18 shows drain-to-source current characteristics at the temperature of 60 K. Five characteristics in not-illuminated states are shown by five different black filled marks, and are identical with the characteristics for the five gate voltages shown by the solid lines in FIG. 4. Other characteristics shown by five open represent an illuminated state. In the experiment, irradiation of the blue LED 500 was switched ON/OFF. Though the current collapse phenomenon is significantly observable at the drain-to-source voltage of 40 V or below, there is improvement in the current collapse phenomenon by injecting the blue-light illumination using the blue LED.

Figure 19:
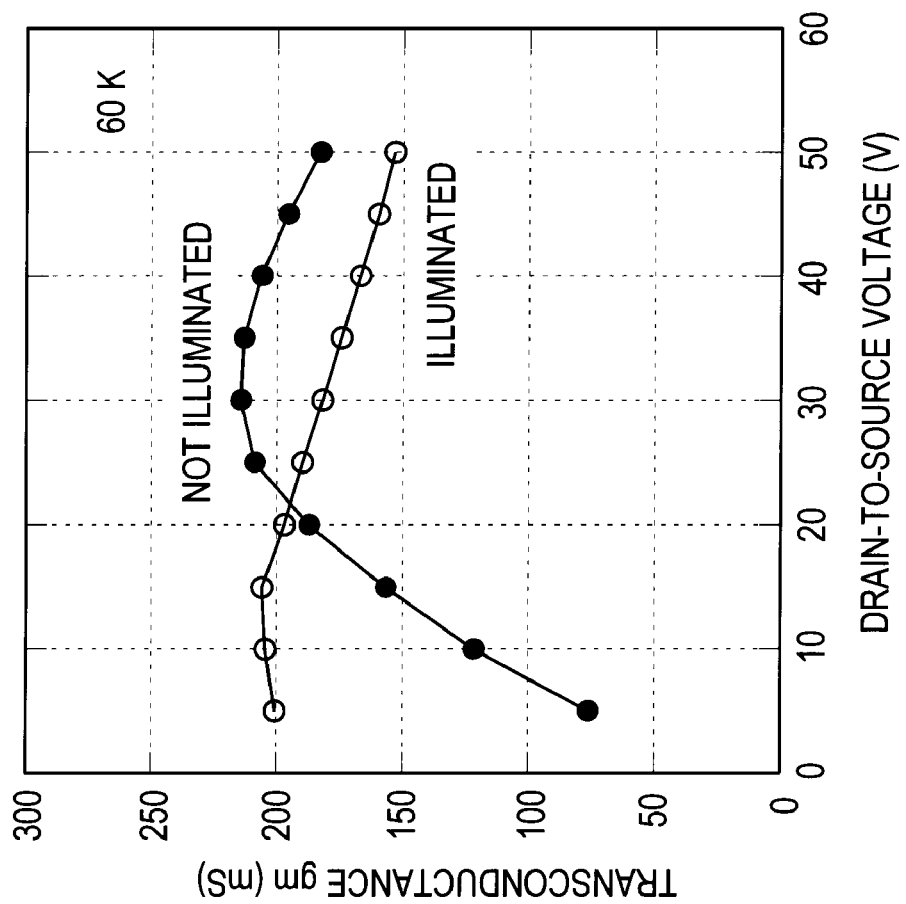
FIG. 19 is a diagram showing results of measurements concerning transconductance characteristics of the cryogenic receiving amplifier shown in FIG. 16.

FIG. 19 shows characteristics of a transconductance (gm). The illumination was made by the light of the blue LED 500 at the drain-to-source voltage of 20 V or below, resulting in the improved transconductance (gm).

Figure 20:
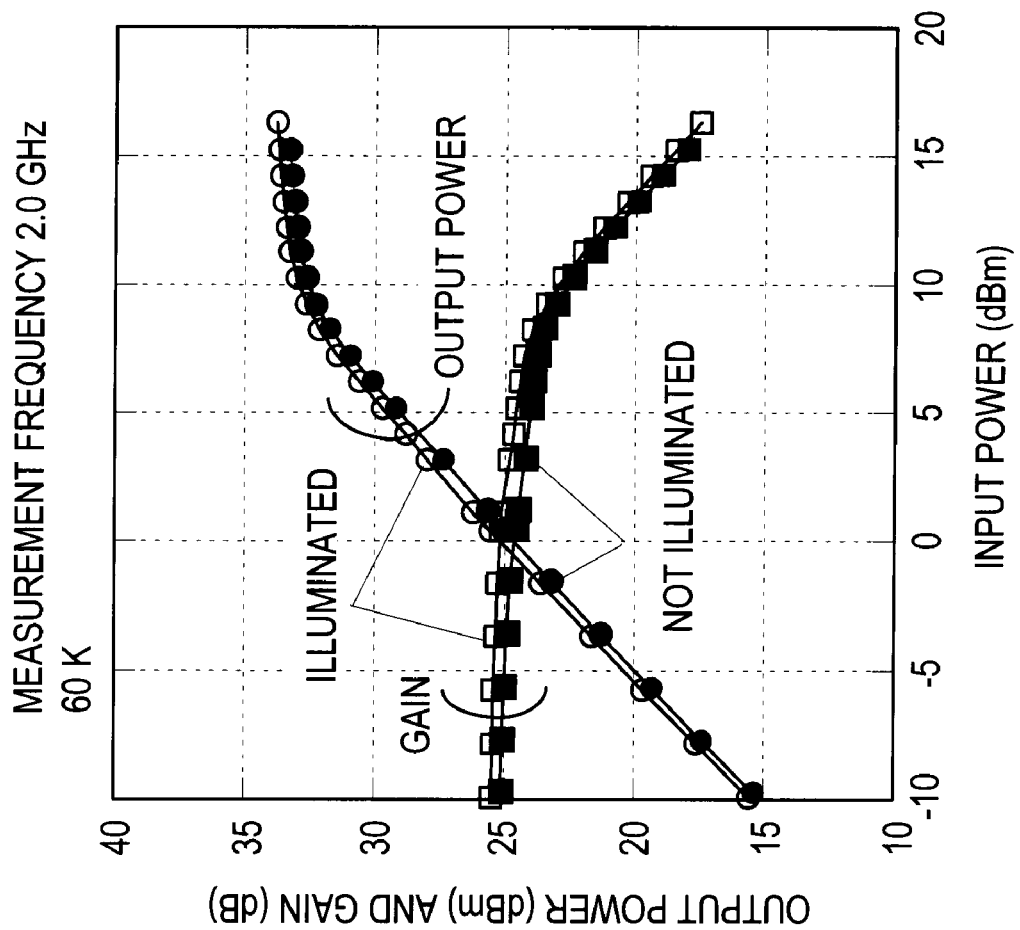
FIG. 20 is a diagram showing results of measurements concerning input/output characteristics of the cryogenic receiving amplifier shown in FIG. 16.

FIG. 20 shows input/output characteristics in which measurements were made at the temperature of 60 K and at the frequency of 2 GHz. The configuration of the cryogenic receiving amplifier 100 is identical with that in the first embodiment. The illumination by the blue LED 500 can improve the gain by 0.5 dB and an output power by 0.5 dB.

Figure 21:
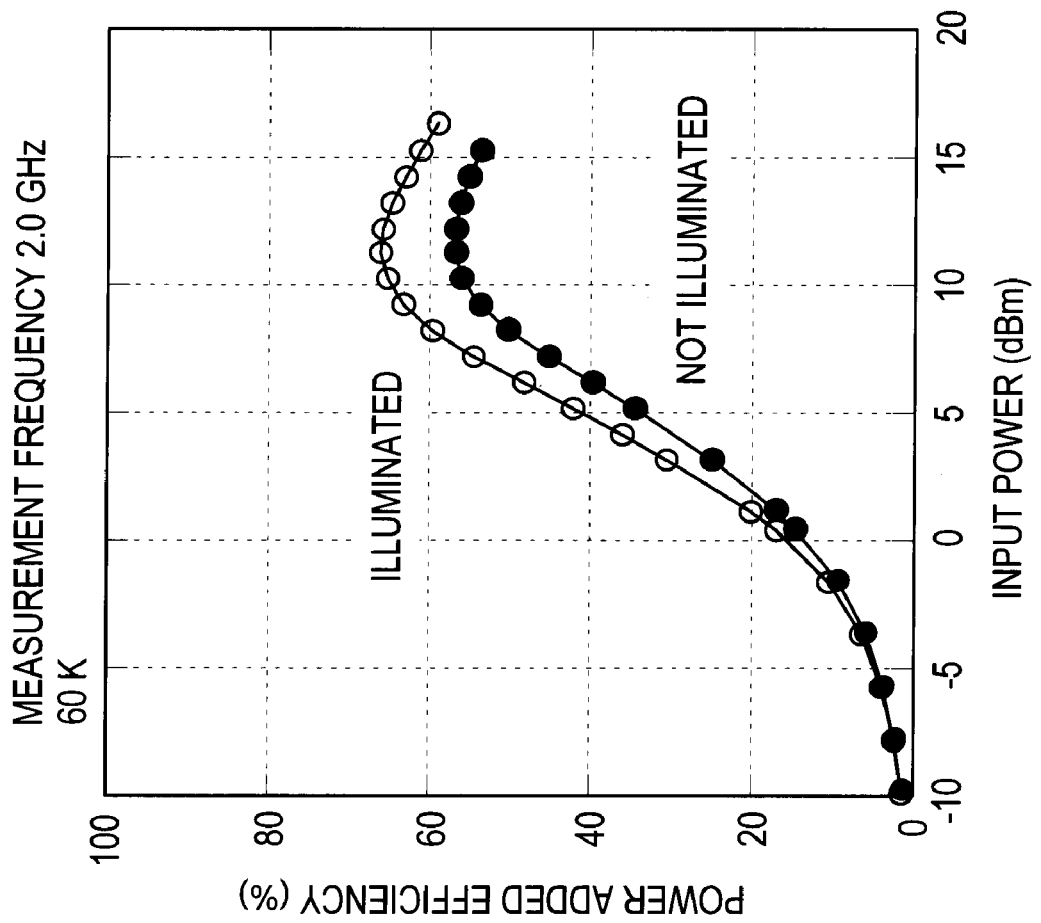
FIG. 21 is a diagram showing results of measurements concerning power added efficiency characteristics of the cryogenic receiving amplifier shown in FIG. 16.

FIG. 21 shows power added efficiency characteristics. The illumination by the blue LED 500 can provide the maximum power added efficiency of 66%, thereby achieving an improvement by 8%. Hence, it is surely possible to improve the power added efficiency by illuminating the GaN HEMT 110 with the light of the blue LED 500 in the cryogenic temperature environment.

According to the third embodiment, it is possible to stabilize the amplifying operation of the cryogenic receiving amplifier 100, and stabilize the operation of the receiver front end.

[Temperature Dependency]

Figure 22:
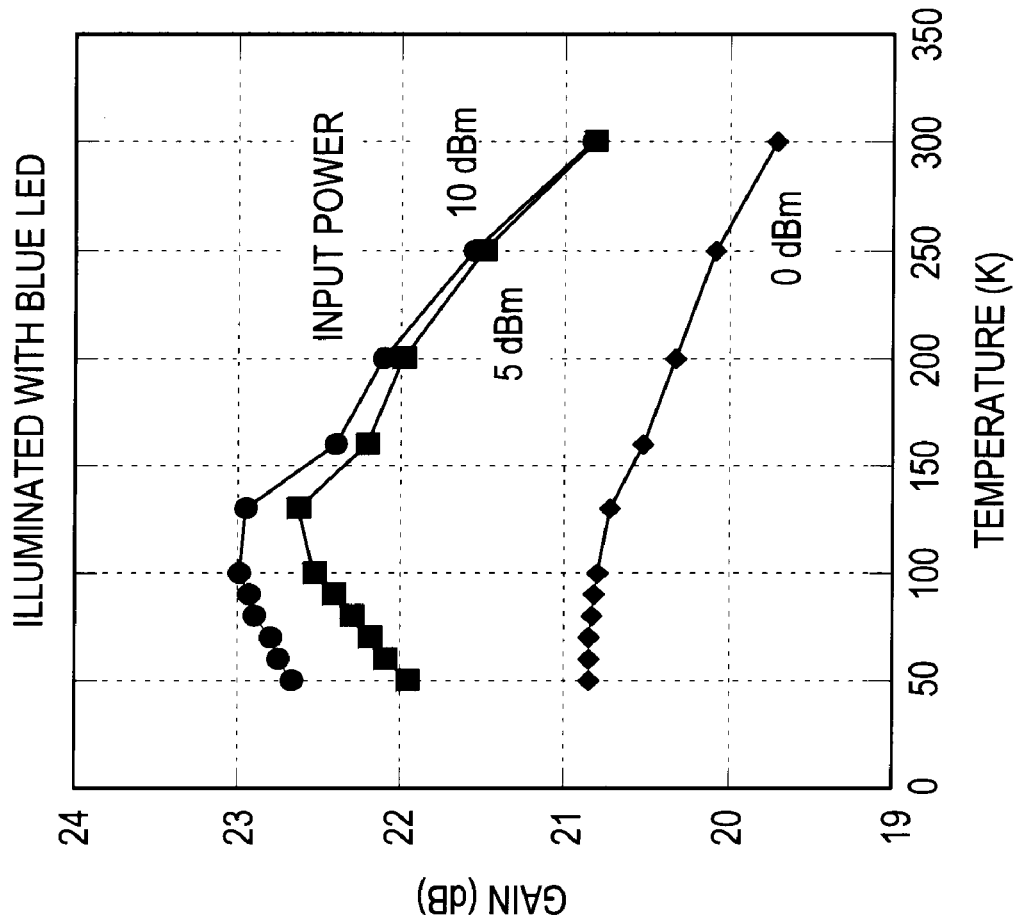
FIG. 22 is a diagram showing results of measurements concerning temperature dependency of the gain of the cryogenic receiving amplifier shown in FIG. 16.

FIG. 22 shows temperature dependency of the gain of the cryogenic receiving amplifier 100, where the GaN HEMT 110 was illuminated with the light of the blue LED 500. In the measurement, the input power of the cryogenic receiving amplifier 100 was set to one of 0 dBm, 5 dBm, and 10 dBm. Additionally, the blue LED 500 was set to have a forward current of 10 mA. Three gain characteristics become maximum or saturated at the cooled temperature of 120 K. A gain deviation at the temperature of 120 K or below is 0.6 dB for the input power of 5 dBm and 0.3 dB for the input power of 10 dBm. Whereas, in a temperature range from 300 K to 120 K, an increased amount of the gain is 2 dB for the input power of 5 dBm and 2.3 dB for the input power of 10 dBm. Thus, because of the temperature dependency of the gain, the cryogenic receiving amplifier 100 using the blue LED 500 is preferably cooled to the temperature of 120 K or below. By the way, in the first embodiment, a preferable temperature for the cryogenic receiving amplifier 100 without the blue LED 500 was 150 K or below. The difference in the preferable temperature is caused by the amplifying characteristic of the GaN HEMT 110 in the cooled environment.

Figure 23:
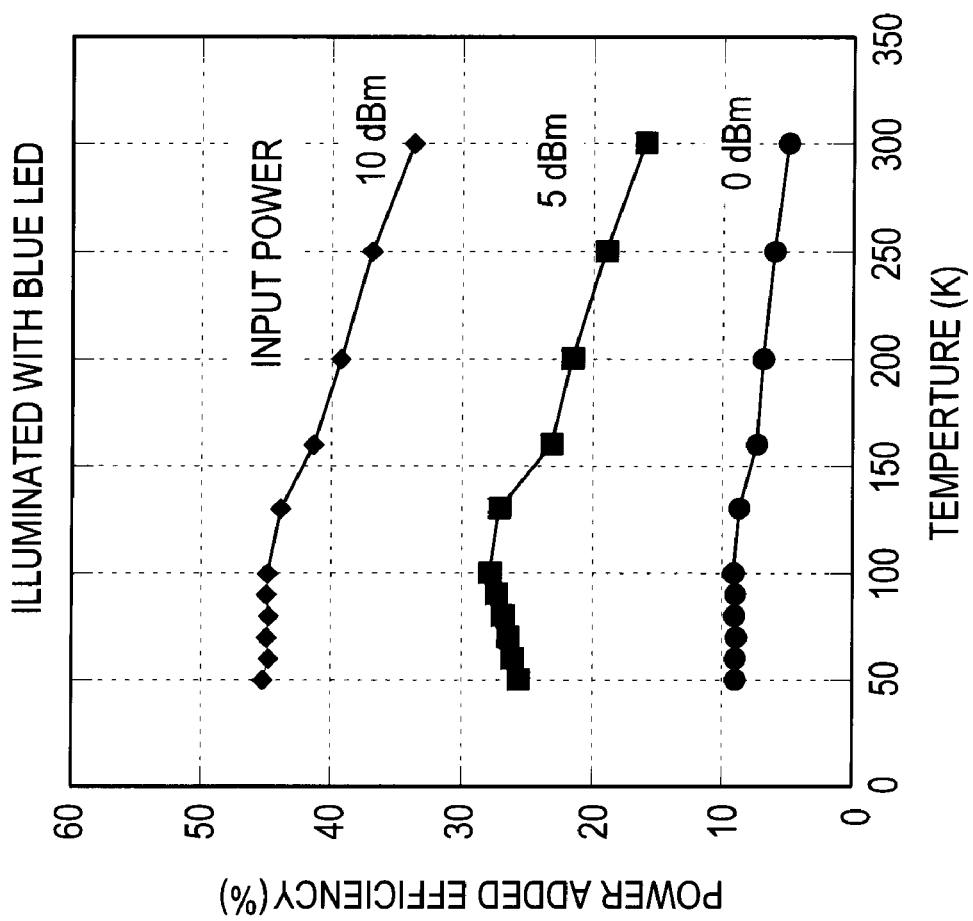
FIG. 23 is a diagram showing results of measurements concerning temperature dependency of the power added efficiency of the cryogenic receiving amplifier shown in FIG. 16.

FIG. 23 shows temperature dependency characteristics of the power added efficiency. At the cooled temperature of 120 K, the power added efficiencies are saturated at their maximum values. In the temperature range from 300 to 120 K, the power added efficiency is improved by 10% for the input power of 10 dBm. This is the same result as that shown in FIG. 11 according to the first embodiment.

As is apparent from FIGS. 22 and 23, in the cryogenic receiving amplifier 100 in which the GaN HEMT 110 is illuminated with the light of the blue LED 500, both the gain and the power added efficiency can sufficiently be improved only by the cooling to the temperature of 120 K or below. It is known that a superconducting filter generally has a critical temperature of 77 K. Therefore, it can be concluded that the cooling power can be reduced, compared to the case of uniformly cooling to the temperature of 77 K by mounting the superconducting filter and the cryogenic receiving amplifier at appropriate positions in the vacuum chamber (see the second embodiment), resulting in saving the cooling power.

Fourth Embodiment

Figure 24:
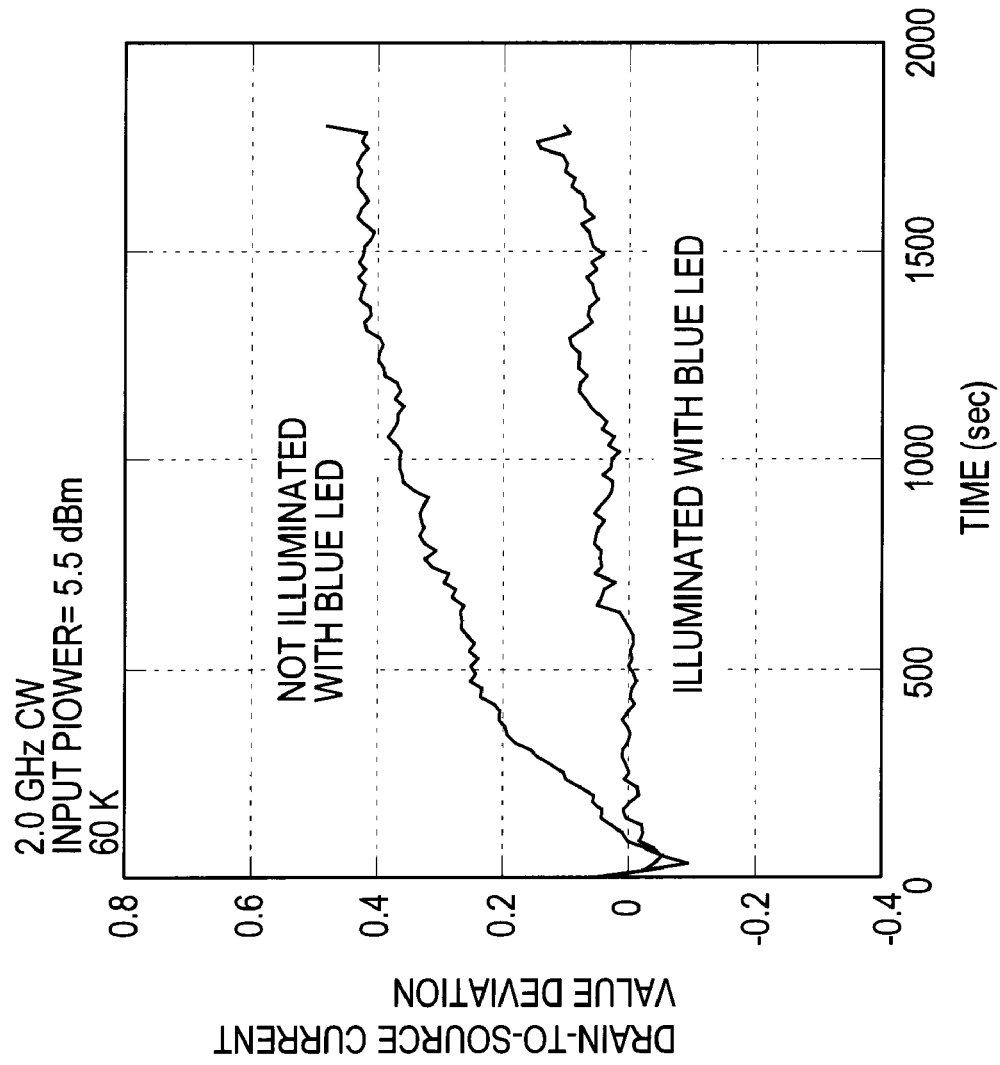
FIG. 24 is a diagram showing results of measurements concerning current stabilization of the cryogenic receiving amplifier shown in FIG. 16.

FIG. 24 shows current value converging characteristics of the cryogenic receiving amplifier 100 when the GaN HEMT 110 is illuminated with light of a blue LED 500. Measurements were made at a cooled temperature of 60 K, at a frequency of 2 GHz, and with an input power of 5.5 dBm. For comparison, there is shown an additional result of measurement in which the GaN HEMT 110 was not illuminated with the light of the blue LED 500. Under the illumination with the light of the blue LED 500, a current value deviation observed for an illumination time period of 1500 sec is 6%. A current value is set to 50 mA so that the current value deviation is 3 mA. Against this, no illumination with the light causes a current value deviation of 42%, i.e., the current value deviation of 21.4 mA for the illumination time period of 1500 sec. As described above, the illumination with the light of the blue LED 500 can stabilize the current value of the cryogenic receiving amplifier 100. It is thereby possible to stabilize an operating point of the cryogenic receiving amplifier 100, resulting in stabilizing a gain, an efficiency, and linearity. If not illuminated with the light of the blue LED 500, it is necessary to run the cryogenic receiving amplifier 100 at idle until the current value is stabilized. In this case, the current value may become unstable due to a variation in transmitting power. Further, a constant-current circuit is needed to stabilize the current value. However, by illumination of light from the blue LED 500, it is possible to carry out the drain-source current stabilization in a simple manner and at high speed.

Figure 25:
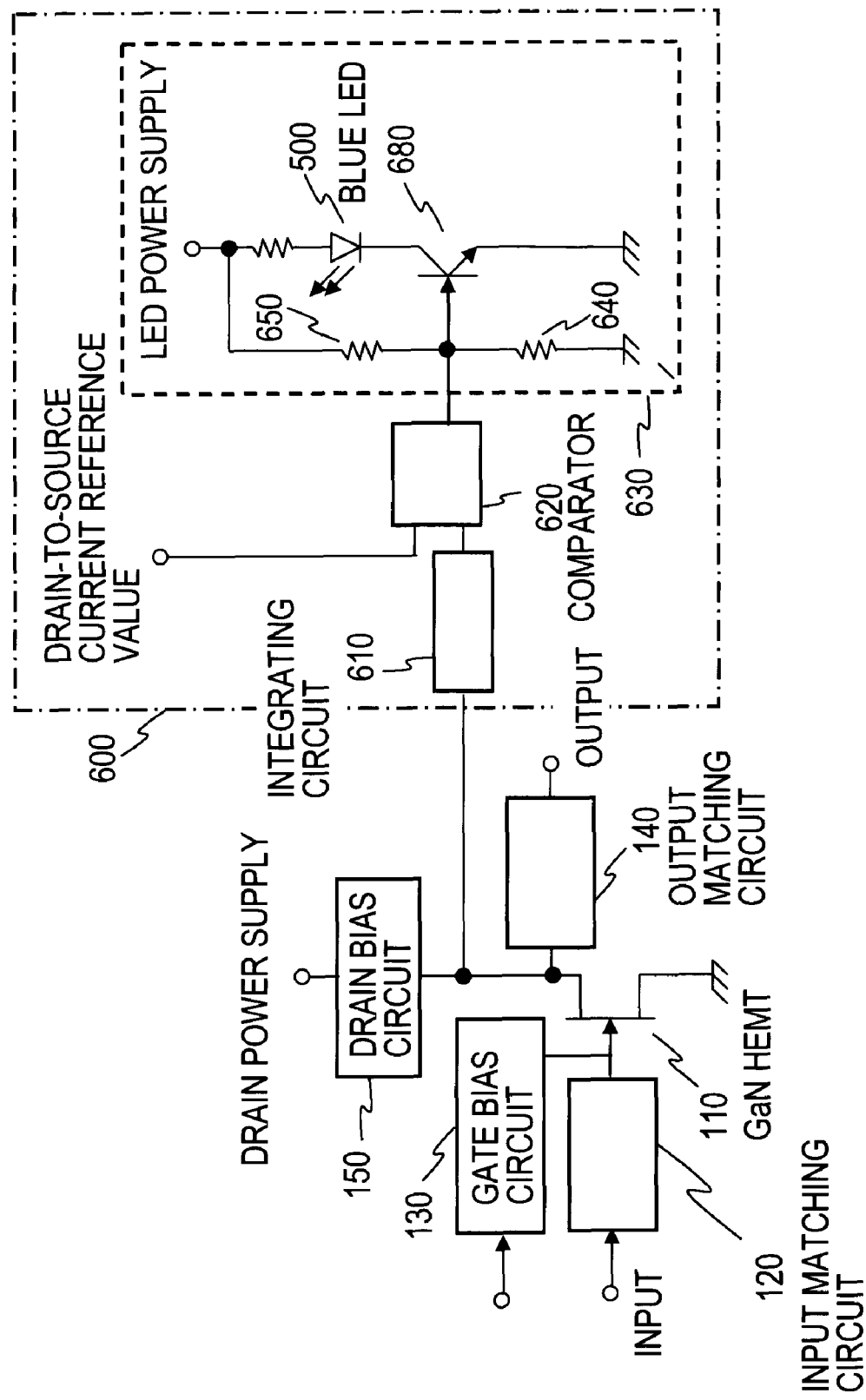
FIG. 25 is a diagram showing an illuminative drain-to-source current stabilizing circuit of the cryogenic receiving amplifier shown in FIG. 16.

FIG. 25 shows an illustrative amplifier obtained by providing the apparatus of FIG. 1 with a blue LED circuit to maintain a constant drain-to-source current at a cryogenic temperature. A circuit 600 includes an integrating circuit 610, a comparator 620, and a blue LED forward current control circuit 630. The integrating circuit 610 monitors the drain-to-source current and integrates the current monitored for a comparatively long integral time period. The comparatively long integral time period is employed because, in the cryogenic temperature environment, a gradual variation in drain-to-source current can be observed for a time period of several minutes. The integrating circuit 610 may include an LC filter circuit with a long time constant. The LC filter may be constructed of lumped constant elements.

The comparator 620 produces a difference between an output of the integrating circuit 610 and a drain-to-source current reference value. If the output of the integrating circuit 610 coincides with the drain-to-source current reference value, the output of the comparator 620 becomes zero. The comparator 620 may be constructed of an operational amplifier, or a differential circuit.

The blue LED forward current control circuit 630 may be constructed of a current-feedback amplifier circuit. Alternatively, the blue LED forward current control circuit 630 may be constructed of a constant current diode. The output of the comparator 620 is inputted into a base of a transistor 680 forming the current-feedback amplifier circuit. After voltage division by two resistors 640, 650, a base biasing voltage is given to the current-feedback amplifier circuit. The base biasing voltage determines a reference value of a forward current. The comparator 620 outputs the difference between the output of the integrating circuit 610 and the drain-to-source current reference value, thereby adjusting the base biasing voltage at the base of the transistor 680 according to a gradual time-varying component. Concurrently, there arises variation in forward current, which causes variation in the intensity of the light of blue LED 500 with which the GaN HEMT 110 is illuminated. More specifically, the forward current is increased if the drain-to-source current of the GaN HEMT 110 is lower than the drain-to-source current reference value, or the forward current is decreased if the drain-to-source current of the GaN HEMT 110 is higher than the drain-to-source current reference value. This switching operation is carried out depending on the time constant of the integrating circuit 610, thereby to stabilize the drain-to-source current of the GaN HEMT 110.

EFFECT OF INVENTION

The present invention employs the gallium nitride high electron mobility transistor (GaN HEMT) as the microwave transistor. Since the GaN HEMT can operate at the higher drain voltage (of 50 V or more), there is an advantage that the output matching circuit can be configured to have a comparatively high impedance. There are other advantages in that the GaN HEMT has a saturation output power of several watts or more, an excellent linearity, and a high power added efficiency. Further, it is possible to employ the gate biasing circuit to make the matching to the gate resistance in the cryogenic temperature environment, thereby assuring the stable operation of the GaN HEMT having a higher gain. Accordingly, it is possible to simultaneously realize, while maintaining the linearity, both the saturation power of 1 W or more and the power added efficiency of 50% or more.

Furthermore, with the GaAs HEMT disposed at the first stage and the GaN HEMT disposed at the second stage, in the cryogenic receiving amplifier having the two-stage configuration, it is also possible to realize a low noise figure, a high saturation output power, and a high power added efficiency.

Additionally, by cooling to the temperature of 150 K or below, it is possible to provide excellent improvements in gain and power added efficiency of the cryogenic receiving amplifier irrespective of the input/output power thereof.

In addition, by the illumination of the gallium nitride high electron mobility transistor with the light, it is possible to improve an increase and a decrease in drain-to-source current which are generated due to the current collapse phenomenon. Besides, by controlling the forward current of the blue light emitting diode, it is possible to stabilize the drain-to-source current, and provide the stable amplifying characteristic even in the cryogenic temperature environment.

What is claimed is:

1. A cryogenic receiving amplifier to be used in a cryogenic temperature environment, comprising:
   a gallium nitride high electron mobility transistor serving as an amplifying device;
   an input matching circuit for making impedance matching between a gate of the amplifying device and an outside of an input terminal of the cryogenic receiving amplifier;
   a gate biasing circuit for applying a DC voltage to the gate of the amplifying device;
   an output matching circuit for making impedance matching between a drain of the amplifying device and an outside of an output terminal of the cryogenic receiving amplifier; and
   a drain biasing circuit for applying a DC voltage to the drain of the amplifying device,
   wherein said cryogenic receiving amplifier further includes light illuminating means for illuminating the gallium nitride high electron mobility transistor with light containing at least a light component having a wavelength corresponding to a band gap of gallium nitride.

2. The cryogenic receiving amplifier according to claim 1, wherein the gate biasing circuit comprises a resistance voltage dividing circuit designed using a gate resistance at a cryogenic temperature.

3. A cryogenic receiving amplifier comprising:
   a first stage amplifier including a gallium arsenide high electron mobility transistor as an amplifying device; and
   a second stage amplifier composed of the cryogenic receiving amplifier of claim 1 connected to the output of said first stage amplifier.

4. The cryogenic receiving amplifier according to any one of claims 1 to 3, wherein the cryogenic receiving amplifier is cooled to a temperature of 150 K or below.

5. The cryogenic receiving amplifier according to claim 1, wherein the light illuminating means comprises a blue light emitting diode.

6. The cryogenic receiving amplifier according to claim 5, further comprising:
   an integrator for integrating a drain-to-source current of the gallium nitride high electron mobility transistor;
   a comparator for producing a difference between an output of the integrator and a reference current value; and
   a controller for controlling a forward current of the blue light emitting diode so that an output of the comparator becomes zero.

7. An amplifying method using a cryogenic receiving amplifier in a cryogenic temperature environment, comprising the steps of:
   cooling a cryogenic receiving amplifier to a temperature of 150 K or below; and
   amplifying an input signal using a gallium nitride high electron mobility transistor as an amplifying device of the cryogenic receiving amplifier to output an amplified signal,
   wherein said amplifying includes illuminating the gallium nitride high electron mobility transistor with light containing at least a light component having a wavelength corresponding to a band gap of the gallium nitride.

8. The cryogenic receiving amplifier according to claim 4, wherein the light illuminating means comprises a blue light emitting diode.

9. The cryogenic receiving amplifier according to claim 8, further comprising:
   an integrator for integrating a drain-to-source current of the gallium nitride high electron mobility transistor;
   a comparator for producing a difference between an output of the integrator and a reference current value; and
   a controller for controlling a forward current of the blue light emitting diode so that an output of the comparator becomes zero.

* * * * *